US008638159B2

(12) United States Patent
Ranta et al.

(10) Patent No.: US 8,638,159 B2
(45) Date of Patent: Jan. 28, 2014

(54) DEVICES AND METHODS FOR IMPROVING VOLTAGE HANDLING AND/OR BI-DIRECTIONALITY OF STACKS OF ELEMENTS WHEN CONNECTED BETWEEN TERMINALS

(75) Inventors: Tero Tapio Ranta, San Diego, CA (US);
Shawn Bawell, Amherst, NH (US);
Robert W. Greene, Lowell, MA (US);
Christopher N. Brindle, Poway, CA (US); Robert Mark Englekirk, Pacific Palisades, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 12/803,064

(22) Filed: Jun. 18, 2010

(65) Prior Publication Data
US 2011/0043271 A1 Feb. 24, 2011

Related U.S. Application Data

(63) Continuation-in-part of application No. PCT/US2009/001358, filed on Mar. 2, 2009.

(60) Provisional application No. 61/067,634, filed on Feb. 28, 2008.

(51) Int. Cl.
*H03K 17/10* (2006.01)
(52) U.S. Cl.
USPC ............ 327/427; 327/344; 327/308; 333/262
(58) Field of Classification Search
USPC ................. 327/355–361, 344, 362, 427, 308; 455/323, 326, 425, 428; 333/262
See application file for complete search history.

(56) References Cited

U.S. PATENT DOCUMENTS

| 4,893,070 | A | 1/1990 | Milberger et al. |
| 5,012,123 | A * | 4/1991 | Ayasli et al. .................. 307/112 |
| 6,531,356 | B1 | 3/2003 | Hayashi |
| 6,683,499 | B2 | 1/2004 | Lautzenhiser et al. |
| 6,747,522 | B2 | 6/2004 | Pietruszynski et al. |
| 6,753,738 | B1 * | 6/2004 | Baird ............................. 331/25 |
| 6,804,502 | B2 | 10/2004 | Burgener et al. |
| 6,889,036 | B2 * | 5/2005 | Ballweber et al. ............ 455/292 |

(Continued)

FOREIGN PATENT DOCUMENTS

| EP | 2568608 A1 | 3/2013 |
| JP | S63-164352 | 7/1988 |

(Continued)

OTHER PUBLICATIONS

Copenheaver, Brian, International Search Report and Written Opinion for related appln. No. PCT/US2009/001358 dated May 27, 2009, 11 pages.

(Continued)

*Primary Examiner* — Dinh T. Le
(74) *Attorney, Agent, or Firm* — Jaquez & Associates; Martin J. Jaquez, Esq.; Alessandro Steinfl, Esq.

(57) ABSTRACT

Devices and methods for improving voltage handling and/or bi-directionality of stacks of elements when connected between terminals are described. Such devices and method include use of symmetrical compensation capacitances, symmetrical series capacitors, or symmetrical sizing of the elements of the stack.

15 Claims, 27 Drawing Sheets

(56) References Cited

U.S. PATENT DOCUMENTS

| | | | |
|---|---|---|---|
| 6,906,653 | B2 | 6/2005 | Uno |
| 7,190,933 | B2* | 3/2007 | De Ruijter et al. ............ 455/125 |
| 7,299,018 | B2 | 11/2007 | Van Rumpt |
| 7,518,458 | B2 | 4/2009 | Nakamura et al. |
| 7,554,789 | B2 | 6/2009 | Chen |
| 7,561,853 | B2 | 7/2009 | Miyazawa |
| 7,825,715 | B1 | 11/2010 | Greenberg |
| 7,960,772 | B2 | 6/2011 | Englekirk |
| 8,044,739 | B2 | 10/2011 | Rangarajan et al. |
| 8,536,636 | B2 | 9/2013 | Englekirk |
| 2002/0120103 | A1 | 8/2002 | Rosen et al. |
| 2005/0017789 | A1 | 1/2005 | Burgener et al. |
| 2005/0068103 | A1 | 3/2005 | Dupuis et al. |
| 2005/0151575 | A1 | 7/2005 | Sibrai et al. |
| 2005/0285684 | A1 | 12/2005 | Burgener et al. |
| 2005/0287976 | A1 | 12/2005 | Burgener et al. |
| 2006/0077082 | A1 | 4/2006 | Shanks et al. |
| 2006/0160520 | A1 | 7/2006 | Miyazawa |
| 2006/0161520 | A1 | 7/2006 | Brewer et al. |
| 2006/0194567 | A1 | 8/2006 | Kelly et al. |
| 2006/0270367 | A1 | 11/2006 | Burgener et al. |
| 2007/0018247 | A1 | 1/2007 | Brindle et al. |
| 2008/0265978 | A1 | 10/2008 | Englekirk |
| 2009/0224843 | A1* | 9/2009 | Radoias et al. ............... 331/158 |
| 2011/0227666 | A1 | 9/2011 | Manssen et al. |
| 2013/0208396 | A1 | 8/2013 | Bawell et al. |
| 2013/0222075 | A1 | 8/2013 | Reedy et al. |

FOREIGN PATENT DOCUMENTS

| | | |
|---|---|---|
| JP | 09-008621 | 10/1997 |
| JP | 2001-510006 | 7/2001 |
| JP | 2002-033660 | 1/2002 |
| JP | 2002-098712 | 4/2002 |
| JP | 2003-516083 | 5/2003 |
| JP | 2005-203643 | 7/2005 |
| WO | WO99/49565 | 9/1999 |
| WO | WO01/41306 | 6/2001 |
| WO | WO2006038190 | 4/2006 |
| WO | WO-2008/133621 | 11/2008 |
| WO | WO-2009/108391 | 9/2009 |

OTHER PUBLICATIONS

Peregrine Semiconductor Corporation, Article 19 Amendment Letter Under Section 205(b) and Rule 46.5(b) PCT filed in WIPO for related appln. No. PCT/US2009/001358, dated Aug. 11, 2009, 12 pages.

Kao, W.H., et al., "Parasitic extraction: current state of the art and future trends", Proceedings of the IEEE, May 2001, vol. 89, Issue 5, pp. 729-739.

Brambilla, A., et al., "Measurements and extractions of parasitic capacitances in ULSI layouts", Electron Devices, IEEE Transactions, Nov. 2003, vol. 50, Issue 11, pp. 2236-2247.

Xu, et al., "An efficient formulation for substrate parasitic extraction accounting for nonuniform current distribution", Circuits and Systems I: Regular papers, IEEE Transactions, Jun. 2004, vol. 51, Issue 6, pp. 1223-1233.

Nabors, et al., "FastCap: A Multipole Accelerated 3-D Capacitance Extraction Program", IEEE Transactions on Computer-Aided Design, vol. 10, No. 11, Nov. 1991, pp. 1447-1459.

Nabors, et al., "Fast Capacitance Extraction of General Three-Dimensional Structures", IEEE Transactions on Microwave Theory and Techniques, vol. 40, No. 7, Jul. 1992, pp. 1496-1506.

Nabors, et al., "Multipole-Accelerated Capacitance Extraction Algorithms for 3-D Structures with Multiple Dielectrics" IEEE Transactions on Circuit and Systems, 1: Fundamental Theory and Applications, vol. 39, No. 11, Nov. 1992, pp. 946-954.

Tausch, et al., "Capacitance Extraction of 3-D Conductor Systems in Dielectric Media with High-Permittivity Ratios", IEEE Transactions on Microwave Theory and Techniques, vol. 47, No. 1, Jan. 1999, pp. 18-26.

Nabors, et al., "A Fast Multipole Algorithm for Capacitance Extraction of Complex 3-D Geometries", IEEE 1989 Custom Integrated Circuits Conference, May 1989, pp. 21.7.1-21.7.4.

Nabors, et al., "Fast Capacitance Extraction of General Three-Dimensional Structures", Proc. Int. Conf. on Computer Design, Cambridge, MA, Oct. 1991, pp. 479-484.

Nabors, et al., "Including Conformal Dielectrics in Multipole-Accelerated Three-Dimensional Interconnect Capacitance Extraction", proceedings of NUPAD IV, Seattle, WA, May 1992, 2 pgs.

Nabors, et al., "Multipole-Accelerated 3-D Capacitance Extraction Algorithms for Structures with Conformal Dielectrics", Proceeding of the 29th Design Automation Conference, Anaheim, CA, Jun. 1992, pp. 710-715.

Phillips, et al., "A Precorrected-FFT method for Capacitance Extraction of Complicated 3-D Structures", Int. Conf. On Computer-Aided Design, Santa Clara, CA, Nov. 1994, 4 pgs.

Phillips, et al., "Efficient Capacitance Extraction of 3D Structures Using Generalized Pre-Corrected FFT Methods", Proceedings of the IEEE 3rd Tropical Meeting on Electrical Performance of Electronic Packaging, Monterey, CA, Nov. 1994, 3 pgs.

Cai, et al., "Efficient Galerkin Techniques for Multipole-Accelerated Capacitance Extraction of 3-D Structures with Multiple Dielectrics" Proceedings of the 16th Conference on Advanced Research in VLSI, Chapel Hill, North Carolina, Mar. 1995, 12 pages.

Kamon, et al., "FastPep: A Fast Parasitic Extraction Program for Complex Three-Dimensional Geometries", Proceedings of the IEEE Conference on Computer-Aided Design, San Jose, Nov. 1997, pp. 456-460.

Young, Lee W., International Search Report received from USRO for related appln. No. PCT/US2007/10331 dated Feb. 15, 2008, 14 pages.

Englekirk, Robert, Preliminary Amendment filed in the USPTO for related U.S Appl. No. 11/796,522 dated Sep. 11, 2009, 9 pgs.

Patel, Reema, Office Action received from the USPTO for related U.S. Appl. No. 11/796,522 dated Oct. 2, 2009, 6 pages.

Englekirk, Robert, Response filed in the USPTO for related U.S. Appl. No. 11/796,522 dated Nov. 2, 2009, 3 pgs.

Shifrin, M., et al., "Monolithic FET Structures for High-Power Control Component Applications", IEEE Transactions on Microwave Theory and Techniques, IEEE Service Center, Piscataway, NJ, US., vol. 37, No. 12, Dec. 1, 1989, pp. 2134-2141.

Shifrin, M., et al., "High Power Control Components using a New Monolithic FET Structure", 19890612; 19890612-19890613, Jun. 12, 1989, pp. 51-56, XP010087270.

Volker, Simon, Communication from the European Patent Office for related application No. 09174085.2-1233 dated Dec. 3, 2009, 6 pgs.

European Patent Office, Communication Pursuant to Rules 161 and 162 EPC received for related appln. No. 07794407.2 dated Dec. 10, 2009, 2 pgs.

Volker, Simon, European Search Report received from the EPO for related appln. No. 07794407.2, dated Mar. 12, 2010, 8 pgs.

Patel, Reema, Office Action received from the USPTO for related U.S. Appl. No. 11/796,522 dated Mar. 2, 2010, 8 pages.

Englekirk, Robert, Amendment filed in the USPTO for related U.S. Appl. No. 11/796,522, dated Jun. 2, 2010, 10 pgs.

Volker, Simon, Communication Pursuant to Article 94(3) EPC received from the EPO for related appln. No. 09174085.2 dated May 4, 2010, 1 pg.

Volker, Simon, Communication Pursuant to Article 94(3) EPC received from the EPO for related appln. No. 07794407.2 dated Jun. 15, 2010, 1 pg.

Peregrine Semiconductor Corporation, Response filed in the EPO for related appln. No. 07794407.2 dated Oct. 20, 2010, 13 pgs.

Peregrine Semiconductor Corporation, Response filed in the EPO for related appln. No. 09174085.2 dated Oct. 20, 2010, 14 pgs.

Patel, Reema, Office Action received from the USPTO for related U.S. Appl. No. 11/796,522, dated Aug. 30, 2010, 15 pgs.

Englekirk, Robert, response filed in the USPTO for related U.S. Appl. No. 11/796,522, dated Dec. 30, 2010, 17 pgs.

Novak, Rodd, "Overcoming the RF Challenges of Multiband Mobile Handset Design", RF/Microwave Switches and Connectors, published Jul. 20, 2007, www.rfdesign.com, 3 pgs.

(56) References Cited

OTHER PUBLICATIONS

Qiao, et al., "Antenna Impedance Mismatch Measurement and Correction for Adaptive CDMA Transceivers", Published Jun. 12-17, 2005, by the IEEE in the 2005 Microwave Symposium Digest, 2005 IEEE MTT-S International, pp. 4, et seq.
Sjoblom, Peter, "An Adaptive Impedance Tuning CMOS Circuit for ISM 2.4-GHz Band", Published in the IEEE Transactions on Circuits and Systems-1: Regular Papers, vol. 52, No. 6, pp. 1115-1124, Jun. 2005.
Sjoblom, Peter, "Measured CMOS Switched High-Quality Capacitors in a Reconfigurable Matching Network", IEEE Transactions on Circuits and Systems-II: Express Briefs, vol. 54, No. 10, Oct. 2007, pp. 858-862.
Patel, Reema, Notice of Allowance received from the USPTO for related U.S. Appl. No. 11/796,522, dated Jan. 28, 2011, 9 pgs.
Brosa, Anna-Maria, extended European Search Report received from the EPO dated Jul. 15, 2011 for related application No. 09715932.1, 12 pgs.
Patel, Reema, Office Action received from the USPTO dated Dec. 5, 2011 for related U.S. Appl. No. 13/046,560, 13 pgs.
Dang, Hung Q., Office Action received from the USPTO dated Dec. 22, 2011 for related U.S. Appl. No. 12/735,954, 32 pgs.
Peregrine Semiconductor Corporation, Response filed in the USPTO dated Feb. 10, 2012 for related appln. No. 09715932.1, 47 pgs.
Cole, Brandon S., Office Action received from the USPTO dated Feb. 24, 2012 for related U.S. Appl. No. 12/803,133, 36 pgs.
Englekirk, Robert Mark, Amendment filed in the USPTO dated Mar. 5, 2012 for related U.S. Appl. No. 13/046,560, 4 pgs.
Ranta, Tero Tapio, Amendment filed in the USPTO dated Mar. 21, 2012 for related U.S. Appl. No. 12/735,954, 16 pgs.
Kurisu, Masakazu, Office Action and translation received from the Japanese Patent Office dated Apr. 17, 2012 for related appln. No. 2010-506156, 4 pgs.
Ranta, et al., Response filed in the USPTO dated May 23, 2012 for related U.S. Appl. No. 12/803,133, 7 pgs.
Patel, Reema, Notice of Allowance received from the USPTO dated May 24, 2012 for related U.S. Appl. No. 13/046,560, 15 pgs.
Cole, Brandon S., Notice of Allowance received from the USPTO dated Jun. 8, 2012 for related U.S. Appl. No. 13/803,133, 12 pgs.
Theunissen, Lars, Communication under Rule 71(3) EPC received from the EPO dated Jul. 2, 2012 for related appln. No. 09715932.1, 98 pgs.
Dang, Hung Q., Notice of Allowance received from the USPTO dated Jul. 12, 2012 for related U.S. Appl. No. 12/735,954, 20 pgs.
Ranta, et al., Comments on Examiner's Statement of Reasons for Allowance filed in the USPTO dated Sep. 10, 2012 for related U.S. Appl. No. 12/803,133, 3 pgs.
Dang, Hung Q., Notice of Allowance received from the USPTO dated Oct. 1, 2012 for related U.S. Appl. No. 12/735,954, 67 pgs.
Patel, Reema, Notice of Allowance received from the USPTO dated Dec. 3, 2012 for related U.S. Appl. No. 13/046,560, 9 pgs.
Dang, Hung Q., Notice of Allowance received from the USPTO dated Jan. 25, 2013 for related U.S. Appl. No. 12/735,954, 42 pgs.
Rojas, Daniel E., Office Action received from the USPTO dated Feb. 21, 2013 for related U.S. Appl. No. 12/803,139, 7 pgs.
Japanese Patent Office, Notice of Allowance received from the Japanese Patent Office dated Dec. 17, 2012 for related appln. No. 2010-506156, 3 pgs.
Patel, Reema, Notice of Allowance received from USPTO on Mar. 15, 2013 for related U.S. Appl. No. 13/046,560, 10 pgs.
Dang, Hung Q., Notice of Allowance received from the USPTO dated May 10, 2013 for related U.S. Appl. No. 12/735,954, 22 pgs.
Ranta, et al., Response filed in the USPTO dated May 20, 2013 for related U.S. Appl. No. 12/803,139, 8 pgs.
Peregrine Semiconductor Corporation, Amendment filed in the EPO dated May 23, 2013 for related appln. No. 09174085.2, 16 pgs.
Utagawa, Tsutomu, English translation of an Office Action received from the JPO dated Jun. 4, 2013 for related appln. No. 2010-548750, 3 pgs.
Englekirk, Robert Mark, Issue Fee Transmittal and Comments on Examiner's Statement of Reasons for Allowance filed in the USPTO dated Jun. 17, 2013 for related U.S. Appl. No. 13/046,560, 4 pgs.
Rojas, Daniel. E., Office Action received from the USPTO dated Jun. 17, 2013 for related U.S. Appl. No. 12/803,139, 36 pgs.
Cole, Brandon, Notice of Allowance received from USPTO dated Jul. 30, 2013 for related U.S. Appl. No. 12/803,133, 136 pgs.
Burgener, et al. Amendment filed in the USPTO dated Aug. 19, 2013 for related U.S. Appl. No. 12/980,161, 20 pgs.
Peregrine Semiconductor Corporation, Response filed in EPO dated Sep. 11, 2013 for related appln. No. 129418.6, 16 pgs.
Dang, Hung, Notice of Allowance received from USPTO dated Sep. 13, 2013 for related U.S. Appl. No. 12/735,954, 16 pgs.
Ranta, et al. Response filed in USPTO dated Sep. 17, 2013 for related U.S. Appl. No. 12/803,139. 14 pgs.
Peregrine Semiconductor Corporation, Response filed in the Japanese Patent Office dated Sep. 4, 2013 for related appln. No. 2010-548750, 11 pgs.

* cited by examiner

US 8,638,159 B2

DEVICES AND METHODS FOR IMPROVING VOLTAGE HANDLING AND/OR BI-DIRECTIONALITY OF STACKS OF ELEMENTS WHEN CONNECTED BETWEEN TERMINALS

CROSS REFERENCE TO RELATED APPLICATIONS-CLAIMS OF PRIORITY

This application is a continuation-in-part of PCT Patent International Application No. PCT/US2009/001358 filed Mar. 2, 2009, entitled "Method and Apparatus for use in Digitally Tuning a Capacitor in an Integrated Circuit Device" which claims the benefit under 35 U.S.C.sctn.119 (e) of U.S. Provisional Application No. 61/067,634, filed Feb. 28, 2008, entitled "Method and Apparatus for Digitally Tuning a Capacitor in an Integrated Circuit Device," both the PCT International Application No. PCT/US2009/001358 and Provisional Application No. 61/067,634 are incorporated herein by reference as if set forth in full; this application is also related to U.S. patent application Ser. No. 12/803,139 and U.S. patent application Ser. No. 12/803,133 both filed on even date herewith, both entitled "Devices And Methods For Improving Voltage Handling And/Or Bi-Directionality Of Stacks Of Elements When Connected Between Terminals"; and both of the related applications are also incorporated herein by reference as if set forth in full.

BACKGROUND

Field

The present disclosure relates to devices and methods for improving voltage handling and/or bi-directionality of stacks of elements when connected between terminals.

SUMMARY

According to a first aspect, a unit cell for a sub-circuit of a digitally tunable capacitor (DTC) is provided, the sub-circuit being adapted to be coupled between a first RF terminal and a second RF terminal, the unit cell comprising: a plurality of stacked switches, the stacked switches proceeding from a first switch closest to the first RF terminal and farthest from the second RF terminal to an n-th switch farthest from the first RF terminal and closest to the second RF terminal, wherein: the first RF terminal is a terminal through which a voltage source is adapted to be coupled to the unit cell; the stacked switches comprise a first set of switches close to the first RF terminal and far from the second RF terminal and a second set of switches far from the first RF terminal and close to the second RF terminal, each switch of the first set and second set being coupled in parallel with a compensating capacitor thus providing a compensated capacitance value for that switch when the switch is in an off state, and each switch of the first set has a corresponding switch of the second set having the same compensated capacitance value.

According to a second aspect, a circuit coupled between a first terminal and a second terminal is provided, comprising: a plurality of stacked switches, the stacked switches proceeding from a first switch closest the first terminal and farthest from the second terminal to an n-th switch farthest from the first terminal and closest to the second terminal, wherein: the first terminal is a terminal through which a voltage source is adapted to be coupled to the circuit; the stacked switches comprise a first set of switches close to the first terminal and far from the second terminal and a second set of switches far from the first terminal and close to the second terminal, each switch of the first set and second set being coupled in parallel with a compensating capacitor thus providing a compensated capacitance value for that switch when the switch is in an off state, and each switch of the first set has a corresponding switch of the second set having the same compensated capacitance value.

According to a third aspect, a circuit coupled between a first terminal and a second terminal is provided, comprising: a plurality of stacked elements, the stacked elements proceeding from a first element closest the first terminal and farthest from the second terminal to an n-th element farthest from the first terminal and closest to the second terminal, wherein: nodes between the elements exhibit parasitic capacitances, the first terminal is a terminal through which a voltage source is coupled to the circuit; the stacked elements comprise a first set of elements close to the first terminal and far from the second terminal and a second set of elements far from the first terminal and close to the second terminal, each element of the first set and second set being coupled in parallel with a compensating capacitor, and each element of the first set has a corresponding element of the second set having the same compensating capacitor value.

According to a fourth aspect, a circuit coupled between a first RF terminal and a second RF terminal is provided, comprising: a plurality of stacked elements, the stacked elements proceeding from a first element closest the first RF terminal and farthest from the second RF terminal to an n-th element farthest from the first RF terminal and closest to the second RF terminal, wherein: nodes between the elements exhibit parasitic capacitances, and the first RF terminal is a terminal through which a voltage source is coupled to the circuit, the circuit further comprising one or more compensation capacitors to compensate the parasitic capacitances, wherein combination between the stacked elements and the compensation capacitors provides a symmetrically compensated plurality of stacked elements with reference to a central node between the elements.

According to a fifth aspect, a circuit coupled between a first terminal and a second terminal is provided, comprising: a plurality of stacked elements, the stacked elements proceeding from a first element closest the first terminal and farthest from the second terminal to an n-th element farthest from the first terminal and closest to the second terminal, a plurality of compensating capacitors associated with the stacked elements, wherein: nodes between the elements exhibit parasitic capacitances, the first terminal is a terminal through which a voltage source is coupled to the circuit; the stacked elements comprise a first set of elements close to the first terminal and far from the second terminal and a second set of elements far from the first terminal and close to the second terminal, the compensating capacitors comprise a first set of compensating capacitors associated with the first set of elements and a second set of compensating capacitors associated with the second set of elements, the first set of compensating capacitors comprises i capacitors (i=1, 2, . . . ), the first capacitor of the first set of capacitors being located in parallel with a first element of the first set of elements, the second capacitor of the first set of capacitors being located in parallel with a series of the first element and a second element of the first set of elements, the third capacitor of the first set of capacitors being located in parallel with a series of the first element, the second element and a third element of the first set of elements and so on, and the second set of compensating capacitors comprises i corresponding capacitors (i=1, 2, . . . ), the first capacitor of the second set of capacitors being located in parallel with a first element of the second set of elements, the second capacitor of the second set of capacitors being located in parallel with a series of the first element and a second element of the second set of elements, the third capacitor of the second set of capacitors being located in parallel with a series of the first element, the second element and a third element of the second set of elements and so on.

According to a sixth aspect, a circuit coupled between a first terminal and a second terminal is provided, comprising: a plurality of stacked switches, the stacked switches proceeding from a first switch closest the first terminal and farthest from the second terminal to an n-th switch farthest from the first terminal and closest to the second terminal, a plurality of compensating capacitors associated with the stacked switches, wherein: nodes between the switches exhibit parasitic capacitances, the first terminal is a terminal through which a voltage source is adapted to be coupled to the circuit; the stacked switches comprise a first set of switches close to the first terminal and far from the second terminal and a second set of switches far from the first terminal and close to the second terminal, the compensating capacitors comprise a first set of compensating capacitors associated with the first set of switches, the first set of compensating capacitors comprises i capacitors (i=1, 2, . . . ), the first capacitor of the first set of capacitors being located in parallel with a first switch of the first set of switches, the second capacitor of the first set of capacitors being located in parallel with a series of the first switch and a second switch of the first set of switches, the third capacitor of the first set of capacitors being located in parallel with a series of the first switch, the second switch and a third switch of the first set of switches and so on.

According to a seventh aspect, a unit cell for a sub-circuit of a digitally tunable capacitor (DTC) is provided, the sub-circuit being adapted to be coupled between a first RF terminal and a second RF terminal, the unit cell comprising: a plurality of stacked switches coupled in series with one or more capacitors, the stacked switches proceeding from a first switch closest the first RF terminal and farthest from the second RF terminal to an n-th switch farthest from the first RF terminal and closest to the second RF terminal, wherein the one or more capacitors are placed symmetrically with respect to the plurality of stacked switches.

According to an eighth aspect, a voltage handling method is provided, comprising: providing a plurality of stacked switches, the stacked switches proceeding from a first switch closest to a first terminal and farthest from a second terminal to an n-th switch farthest from the first terminal and closest to the second terminal, the first terminal being a terminal through which a voltage source is coupled to the unit cell; and coupling the stacked switches in series with one or more capacitors, the one or more capacitors being placed symmetrically with respect to the plurality of stacked switches.

According to a ninth aspect, a method for compensating parasitic capacitances is provided, comprising: providing a plurality of stacked switches, the stacked switches proceeding from a first switch closest to a first terminal and farthest from a second terminal to an n-th switch farthest from the first terminal and closest to the second terminal, the first terminal being a terminal through which a voltage source is adapted to be coupled to the stacked switches; and sizing the stacked switches so that the first switch has the same size of the n-th switch.

According to a tenth aspect, a stacked device is provided, comprising: a plurality of stacked switches, the stacked switches proceeding from a first switch closest to a first terminal and farthest from a second terminal to an n-th switch farthest from the first terminal and closest to the second terminal, the first terminal being a terminal through which a voltage source is adapted to be coupled to the stacked switches, the stacked switches being sized such that the first and the n-th switch have the same size.

Further embodiments of the disclosure are provided in the specification, claims and drawings of the present application.

DETAILED DESCRIPTION

Figure 1:
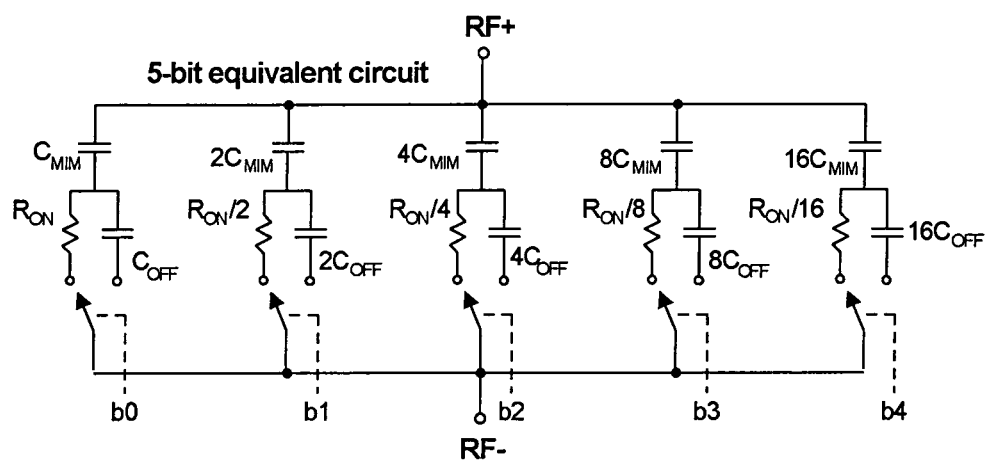
FIG. 1 shows an equivalent circuit with ON resistances and OFF capacitances of a digitally tunable capacitor (DTC) circuit.

FIG. 1 corresponds to FIG. 5D of PCT Patent Application No PCT/US2009/001358 incorporated herein by reference in its entirety. FIG. 1 is an equivalent circuit showing the ON resistances and OFF capacitances associated with switching FETs of a digitally tunable capacitor (DTC) circuit disclosed in PCT Patent Application PCT/US2009/001358.

Figure 2:
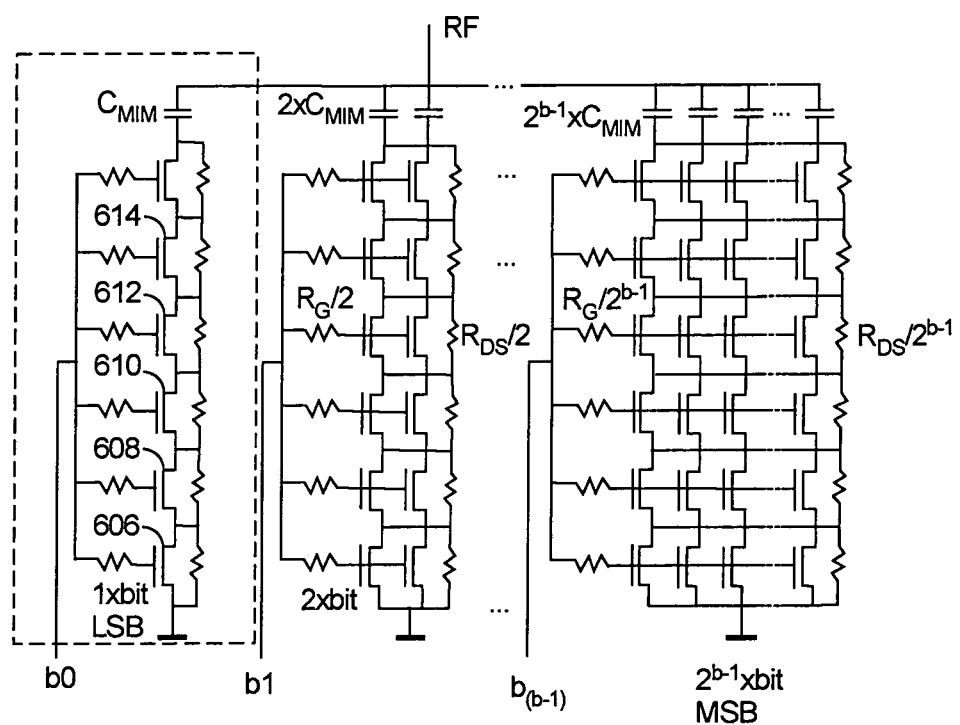
FIG. 2 shows a plurality of stacked FETs of a DTC circuit coupled in series.

FIG. 2 shows design details of an embodiment of a DTC where a plurality of stacking FETs are coupled in series with associated and corresponding metal-insulator-metal (MIM) or metal-metal (MM) capacitors.

Figure 3:
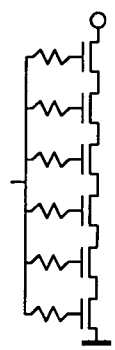
FIG. 3 shows a detail of the circuit of FIG. 2 without MIM capacitors.
Figure 4:
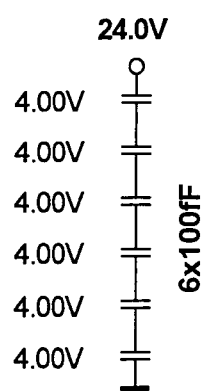
FIG. 4 shows an equivalent circuit of the circuit of FIG. 3 with OFF capacitances in an ideal condition, where the voltage difference is equally divided among the transistors.

FIG. 3 represents a detail of the circuit of FIG. 2 without MIM (or MM) capacitors, while FIG. 4 shows an equivalent circuit of the circuit of FIG. 3 where all FETs of the FET stack are OFF. Assuming that the voltage at the top of the stack is, for example, 24 V and the voltage at the bottom of the stack is, for example, ground, in an ideal condition the voltage difference is equally divided among the transistors. This ideal condition is represented in FIG. 4 by showing a voltage drop of 4 V across each OFF capacitance $C_{OFF}$. It should be noted that in the embodiment of FIG. 4 the voltages are the peak values of a sinusoidal signal. The stack height for this stack would be 6, because there are 6 devices in series. In this case, there is equal voltage division across the stack so in order to get the voltage across a device one would divide the source voltage by 6.

Figure 5:
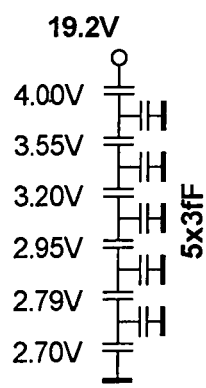
FIG. 5 shows a circuit where parasitic capacitances are present.

However, the presence of parasitic capacitances can be problematic. FIG. 5 shows a simplistic representation of such capacitances to ground, the presence of which does not allow an equal division of the voltage difference across the transistors, thus reducing the efficiency of the stack. A possible figure of merit for asymmetric voltage division is the effective stack height which is Vsource/Vmax. In this context Vmax is the voltage across the FET closest to the source when the given Vsource is applied. The effective stack height is the resulting stack height observed with the presence of parasitic and compensation within the stack. In this case the effective stack height would be 19.2V/4V=4.8 which is less than the ideal value of 6 assuming no parasitics. This means that in order to get the max voltage across a device one would divide the source voltage by 4.8.

Although the parasitic capacitances of FIG. 5 go to ground, the parasitic capacitances from the internal nodes can go to any number of places. In a standard CMOS they may go to the substrate. In an SOI or GaAs process they may go to the package or metal on the back of the part. Parasitic capacitances can also go to nearby metal lines which may also have signal content on them. However, they all include capacitance from an internal node to some other node and can be fairly modeled through the representation of FIG. 5.

Figure 6:
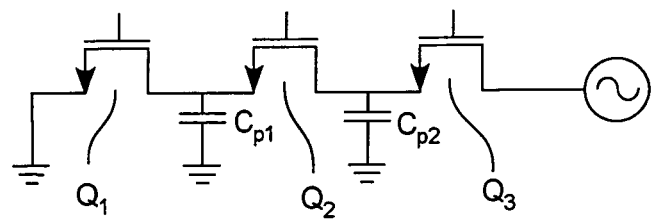
FIGS. 6 and 8 show stacks of three and sixteen transistors, respectively, with parasitic capacitances.
Figure 7:
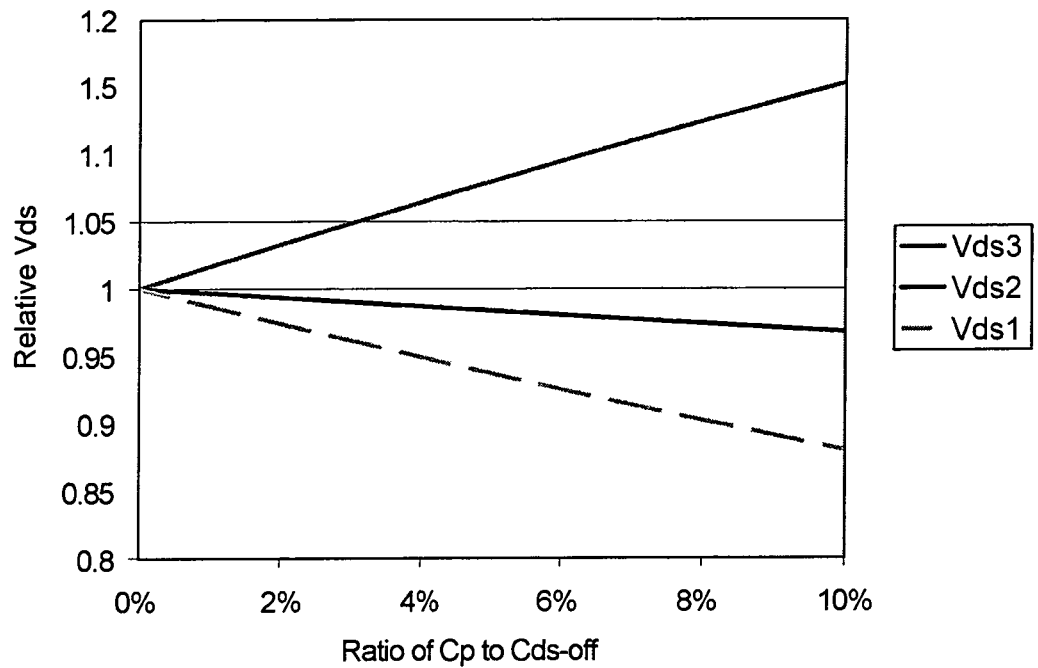
FIGS. 7, 9 and 10 are waveforms showing the reduced efficiencies of a stack of capacitors in presence of parasitic capacitances.
Figure 8:
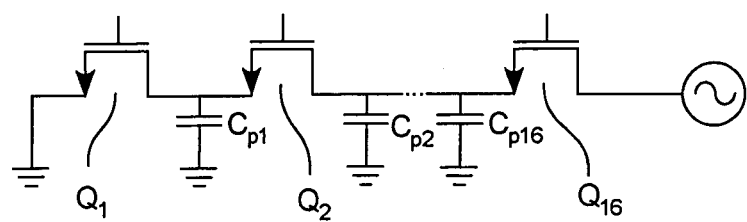
Figure 9:
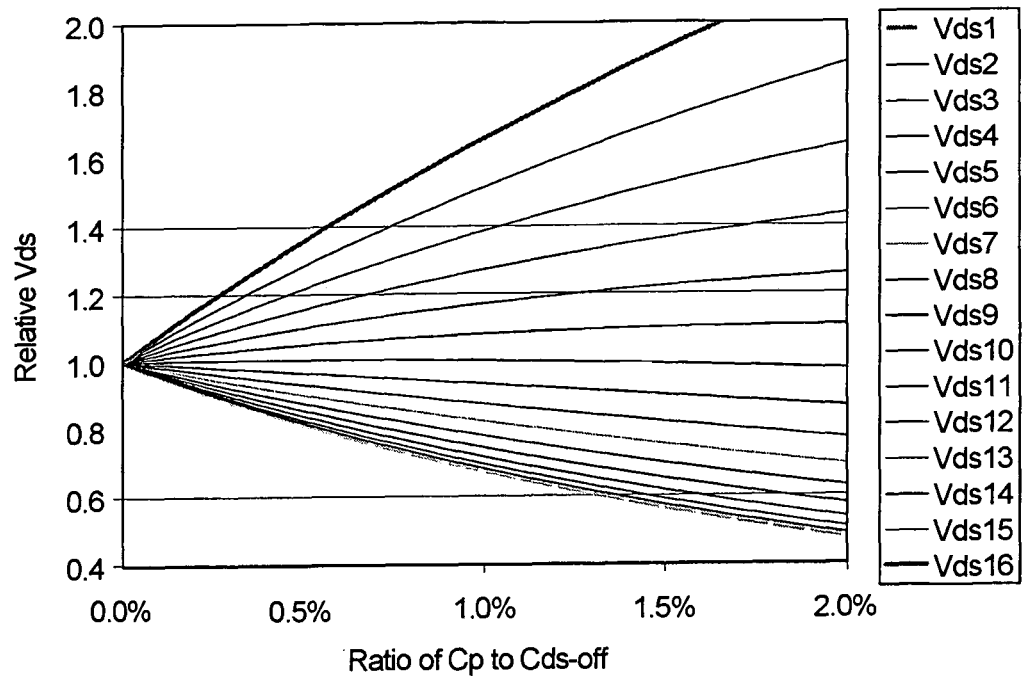
Figure 10:
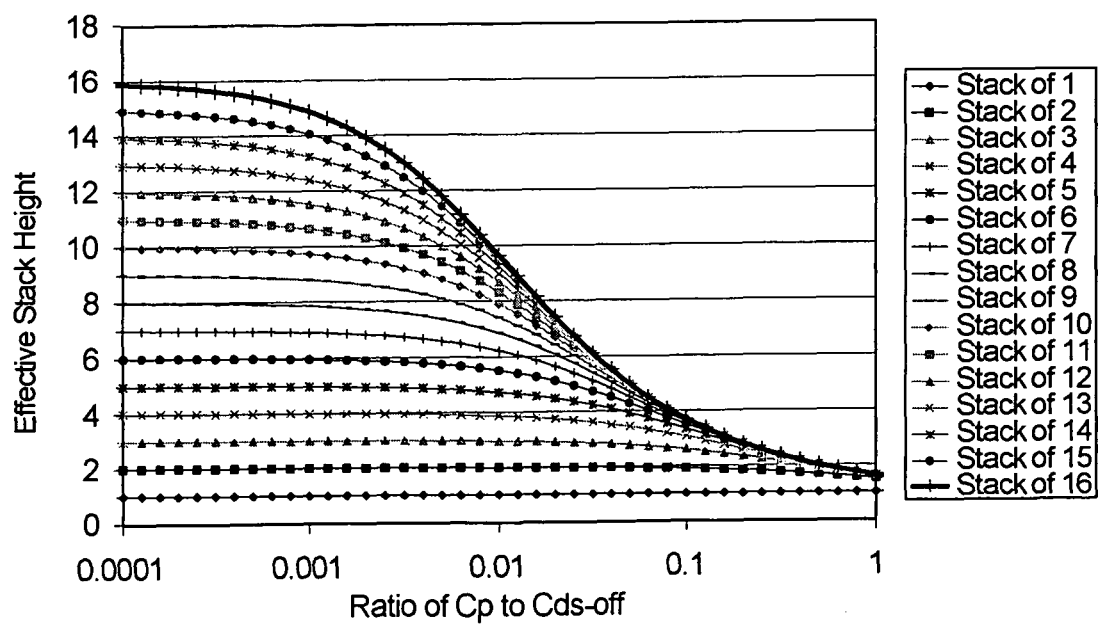

FIGS. 7 and 9 show relative Vds as a function of parasitic capacitance. Relative Vds is defined as the actual voltage across the FET in the presence of parasitics divided by the voltage across the FET if there were no parasitic. FIG. 10 shows the reduced efficiencies of a stack of capacitors in presence of parasitic capacitances. In particular, FIG. 7 refers to the stack of 3 transistors of FIG. 6, while FIGS. 9 and 10 refer to the stack of 16 transistors of FIG. 8.

FIG. 7 shows relative Vds of transistors as a function of a ratio of Cp to Cds-off in the exemplary stack of three transistors of FIG. 6. As Cp becomes appreciable in comparison to Cds-off, there is no longer equal voltage division in the stack (Relative Vds diverges from unity).

At larger stack heights (number S of transistors>>3), the relative Vds divergence from unity becomes worse. FIG. 9 shows what happens for the exemplary stack of 16 transistors of FIG. 8. Much smaller ratios of Cp to Cds-off can make very significant voltage asymmetries through the stack. For example, when Cp is just 1.6% of Cds-off, there is twice as much voltage across transistor 16 as would be expected without parasitic capacitances. Thus, a stack of 16 transistors with parasitic capacitances is operating equivalent to a stack of 8 transistors without parasitic capacitances, but at the cost of four times more device area.

FIG. 10 shows the effect of parasitic capacitances on the efficiency of the stack of FIG. 8. With little or no parasitic capacitances compared to Cds-off, the stack operates as expected. As the ratio of the parasitic capacitance to Cds-off increases, the top transistor in the stack (i.e. the transistor nearest the voltage source) typically sees much more Vds than the rest of the transistors, and the transistors no longer equally share the source voltage. This reduces the stack efficiency. For a stack of 16, ideally the breakdown of the stack would be 16×BVds (where BVds is the breakdown voltage of the transistor), but at a Cp/Cds-off ratio of 1.6% (0.016), it will breakdown at 8×BVds as shown in FIG. 10. Thus, at a given ratio of parasitic capacitance Cp to Cds-off for a given process, there is a limit to the maximum stack height.

Embodiments of the present disclosure are directed at solving the above mentioned problems by adding compensation capacitors across the drain and source of at least the top FETs of the stack closest to the voltage source to decrease asymmetric voltage division.

Figure 11:
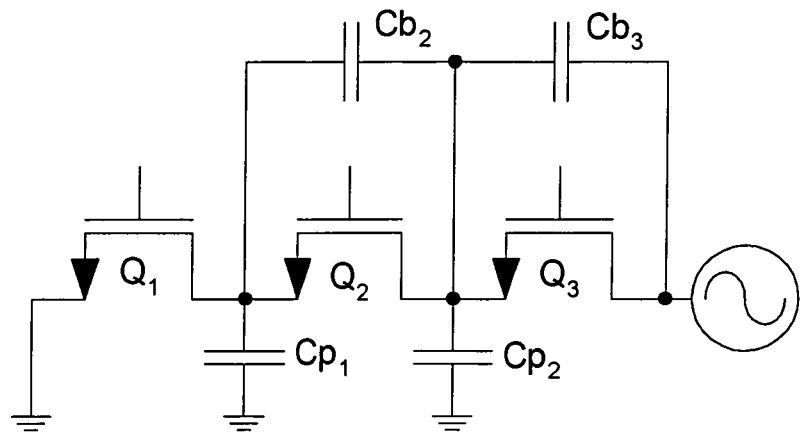
FIGS. 11-13 show embodiments where compensation capacitors are present.
Figure 12:
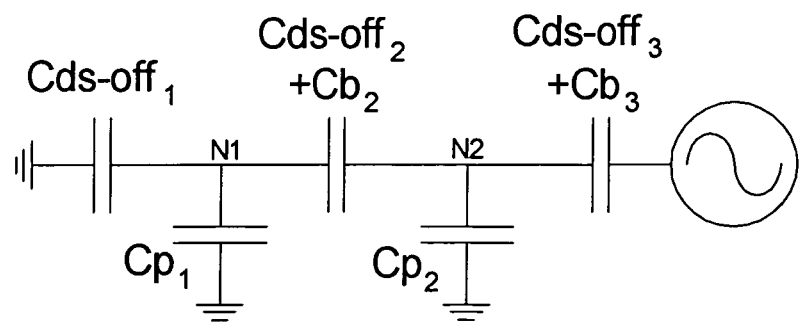

FIGS. 11 and 12 show a simplified model of a stack with three FETs (already shown in FIG. 6) which will be used for purposes of the calculation below, where Cb2 and Cb3 represent the compensation capacitors in accordance with the present disclosure.

In accordance with the embodiment of FIG. 11 and its equivalent of FIG. 12, for equal voltage division at node 1, $Cb_2$ would have to be equal $Cp_1$. As such, the capacitance looking left of node 2 would be (Cds-off+$Cp_1$)/2, assuming all Cds-off are the same. For proper voltage division at node 2, the total effective Cds of Q3 would have to be equal to twice that of $Cp_1$ and the capacitance to the left of it.

$$Cds_3\text{-}eff=2\times((Cds\text{-off}+Cp_1)/2+Cp_2)=Cds\text{-off}+Cp_1+2Cp_2$$

Thus, $Cb_3=Cp_1+2Cp_2$

For higher and higher stack heights it can be proven that the required additional capacitance across a given transistor Qn is:

$$Cb_n = \sum_{i=1}^{n-1} i \times Cp_i \text{ for } n > 1, \text{ since } Cb_1 = 0$$

assuming that all transistors have the same Cds-off.

This shows that there is a geometric progression in additional capacitance required to fully compensate for the voltage asymmetry as the stack increases.

In larger stacks of devices, parasitic capacitances can go to any node in the stack or signal related nodes. Thus for example, node $N_1$ would have capacitance to $N_2$ called $Cp_{12}$, to $N_3$ called $Cp_{13}$, and so on. For purposes of the following calculations, it can be assumed that node $N_0$ is ground, and node $N_1$ is one transistor away from ground, and the higher the node number, the farther from ground. To properly compensate all of these capacitances on all nodes, the net charge induced on each node from all capacitors connected to that node should cancel. Since Q=CV=0 for node j:

$$0 = \sum_{i=0}^{P-1} (Vi - Vj) \times Cij$$

where:
P is the total number of capacitors on node j; and
Cij is the total capacitance between node i ($N_i$) and node j ($N_j$) which includes parasitic capacitance, compensation capacitance previously added on other nodes, and device Cds-off capacitance.

If it is further assumed that the only capacitances are to nodes in the device stack or ground, and that the voltage across the stack divides evenly (as desired), then the voltages all become integer relations.

$$0 = \sum_{i=0}^{S} (i - j) \times Cij$$

where S is the integer number of transistors in the stack.

Figure 13:
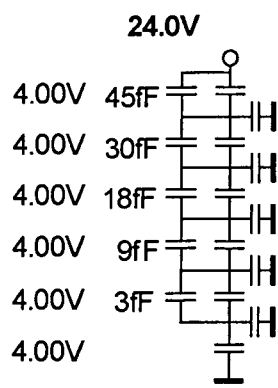

FIG. 13 shows an embodiment with a stack of six transistors, where compensation capacitors of 45, 30, 18, 9 and 3 fF are used. It should be noted that the effective stack height is back to its ideal value of 6.

In accordance with an embodiment of the present disclosure, assuming a stack of N transistors without MIM capacitors, N−1 capacitors can be used to achieve perfect symmetry. However, embodiments are also possible where less than N−1 capacitors are added, starting with the transistor closest to the voltage source (top capacitor of the stack in FIG. 5, or transistor Q3 in FIG. 11), to improve the effective stack height while not necessarily attaining equal voltage division.

Figure 40:
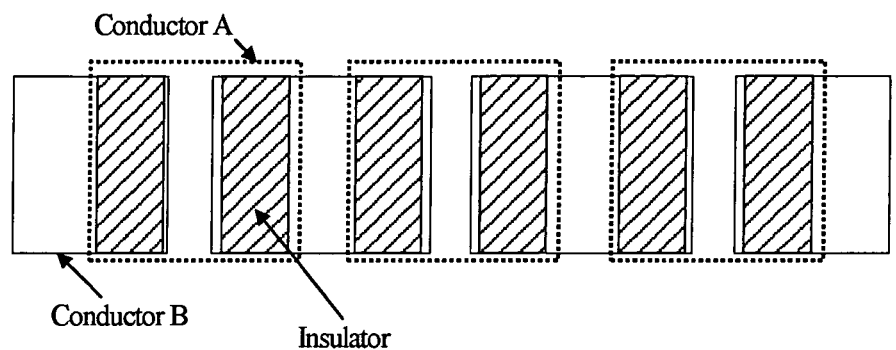
FIGS. 40 and 41 show an embodiment where size of the elements of the stack is varied.
Figure 41:
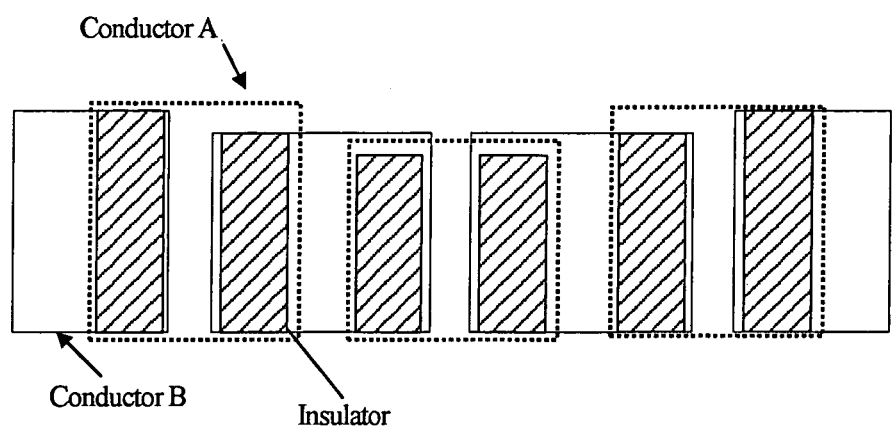

A further embodiment of the present disclosure is directed at compensation for parasitics by sizing the devices rather than adding compensation capacitance across the drain and source of the FETs. The Coff of a device is usually linearly related to the size of the device. By putting larger devices closer to the voltage source, the effects of parasitics can be reduced. Reference can be made, for example, to FIGS. 40 and 41. In particular, FIG. 41 shows how variation of the size of the devices can be obtained. Care should be taken in noting the increase in parasitics due to the increase of the size of the devices. Compensating this way has the benefit of not introducing the process variation of the compensation capacitors (such as MIM) which can be substantial and unrelated to FET Coff process variation. Embodiments of the present disclosure can be provided where the stacked switches are sized so that the first switch (the one closest to the terminal connected to the source) has the same size of the last switch (the one farthest from the terminal connected to the source). With reference to switch FETs, further embodiments can also be provided where also the second switch has the same size of the one before last, and so on. According to another embodiment, the sized first and n-th switches can be larger than the sized second and (n−1)-th switches, and so on.

Figure 14:
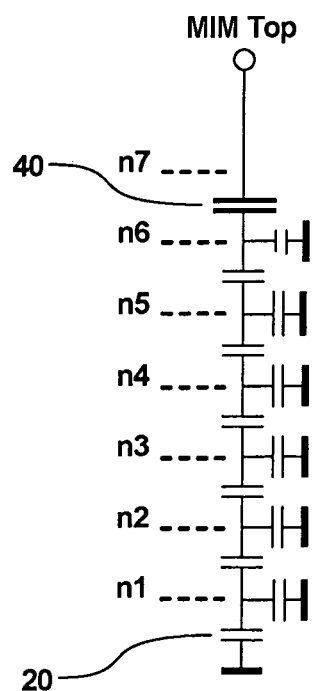
FIG. 14 shows a stack of OFF capacitances of a DTC with a MIM capacitor on top of the stack.

The above embodiments do not consider the presence of the MIM capacitors (10) of FIG. 1. Reference can be made to FIG. 14, which shows a representation of OFF capacitances (20) in a stacked configuration where parasitic capacitances (30) are present and where a MIM capacitor (40) is shown on top of the stack. In a digitally tuned capacitor, MIM capacitors are switched in and out of the circuit using the switch FETs. When the switch FETs are ON, the capacitance of the stack is determined by the MIM capacitor. When the switch FETs are OFF, the capacitance of the stack is reduced by presence of the OFF capacitance. Therefore, the MIM capacitors determine the upper limit of the capacitance tuning range.

The embodiment shown in FIG. 11 can be extended to the case of stacks with MIMs. In this case, the MIM will drop some of the voltage, reducing the voltage across the FETs. Compensation capacitance can still be added to the devices to achieve equal voltage division across the FETs only. As compensation capacitance is added to a FET, the effective Coff is increased reducing its impedance. It can be noted that adding compensation capacitance has little effect on the circuit performance when the FETs are on due to the relatively small values for Ron. In particular, compensation capacitors can be used on all devices and increased without bound hypothetically until the majority of the voltage is dropped across the MIM. The limit to the compensation capacitance value in stacks with MIMs is the maximum stack off-capacitance required which, neglecting parasitic and assuming constant $C_{off}$ across the stack is $C_{stack}=C_{MIM}$ in series with $C_{off}/N$, where N is the number of devices. It can be noted that the Coff here includes the effect of the added compensation capacitance. Also in this case embodiments are possible where less than N−1 capacitors can be added, starting with the transistor closest to the voltage source, to improve the effective stack height while not necessarily attaining equal voltage division.

Several embodiments of the present application specify the presence of a first RF terminal and a second RF terminal. However, the person skilled in the art will understand that embodiments of the present disclosure are also directed to the presence of terminals which are not RF terminals.

Additionally, several embodiments of the present application are directed to a stack of switches, such as FET switches. However, the person skilled in the art should appreciate that elements different from switches (such as inductors, resistors, capacitors, diodes and so on) can be provided and the teachings of the present disclosure can be applied to these embodiments as well.

Furthermore, while several embodiments of the present disclosure deal with digitally tuned capacitors (DTCs), the teachings of the present disclosure can be applied to fields where stacked devices are used different from the field of DTCs, such as switches or attenuators.

In the compensation schemes shown in the above figures at least one of the RF terminals is grounded. A typical application would be the DTC in shunt to ground. However, generally speaking, the stack can be used in applications where none of the terminals RF+ or RF− is grounded, e.g., using the DTC in series. In such cases, the above compensation schemes are not bidirectional and are effective only if the stack is driven with the voltage source as shown in the above figures and not vice versa. Moreover, such schemes are effective if the RF− terminal (or the Q1 source terminal in FIG. 11) is either matched or grounded. If RF− is not matched when RF+ is driven (Q3 drain in FIG. 11), there are load mismatch conditions whereby the signal delivered to the load would reflect back into Q1 source. When the signal is incident on a compensated stack port (for example the Q1 source terminal in FIG. 11) that was compensated to be driven using the other port (Q3 drain in FIG. 11), the effective stack height can be worse than an uncompensated stack. This is a probable event when the stack (or DTC) is used in a tuner for impedance matching.

Figure 15:
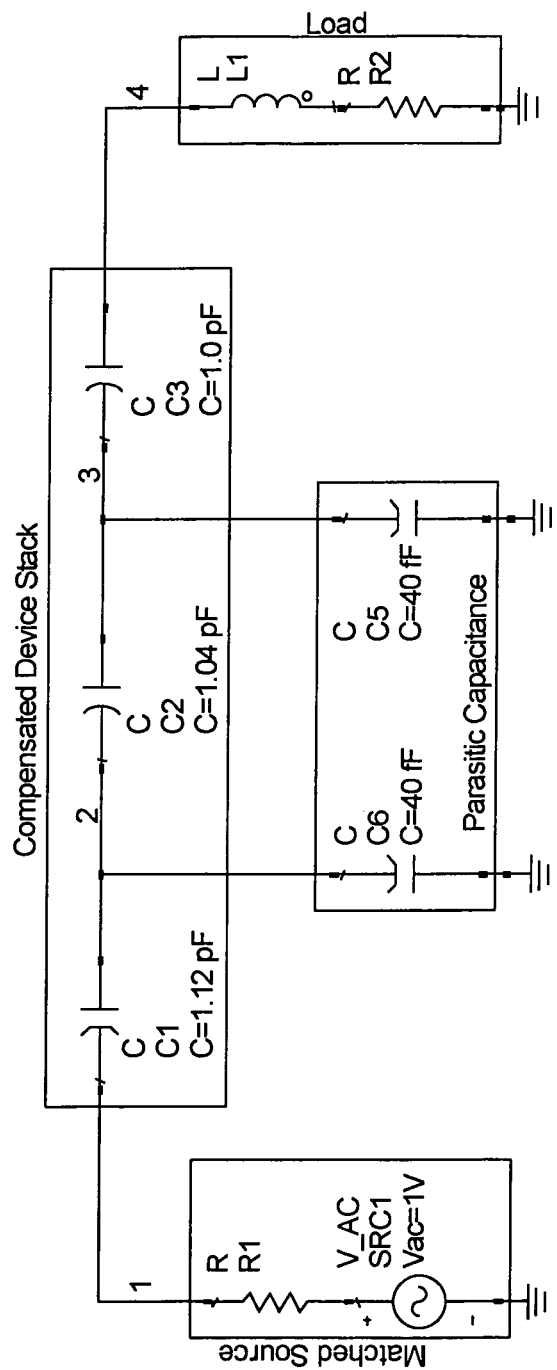
FIGS. 15-17 show behavior of asymmetric stack in presence of a reactive load.
Figure 16:
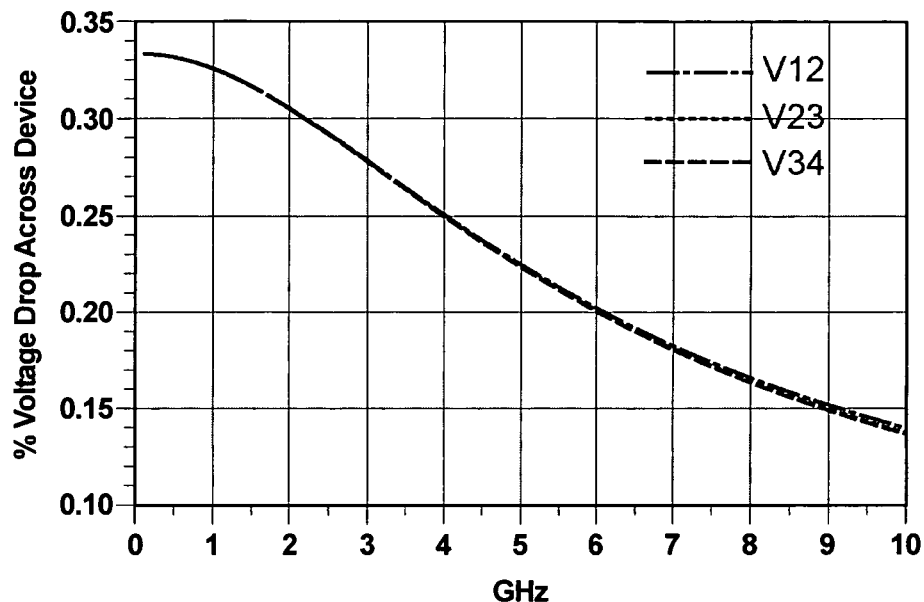
Figure 17:
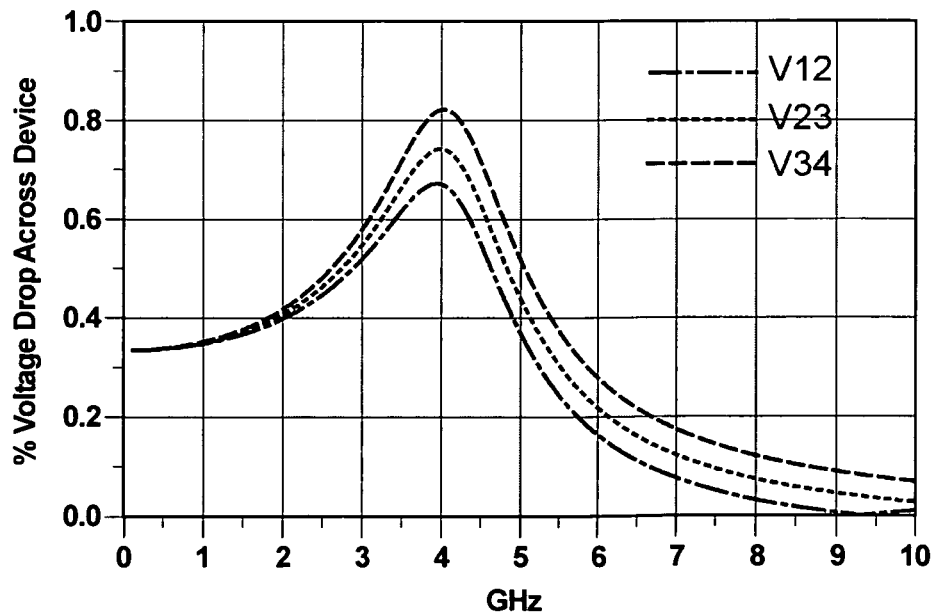

FIGS. 15-17 show the above problem and illustrate how voltage divides across an asymmetrically compensated stack when under mismatched load conditions. In particular, as shown in FIG. 15, V12 (voltage across C1), V23 (voltage across C2) and V34 (voltage across C3) are sensibly different among themselves when the load is reactive (see inductive reactance component L1 in FIG. 15). It should be noted that in the representation of FIG. 15 the values C2, C3 represent the combined Cds−OFF+Cb capacitances, similarly to what shown in FIG. 12.

The present disclosure overcomes the above problem by providing embodiments according to which the bottom compensation capacitors have the same value of the top compensation capacitors. More generally, assuming that the devices do not have the same Coff, embodiments are provided where compensation capacitances are provided so that the resulting capacitance of the compensated devices is such that the values of such resulting capacitances are symmetrical with respect to the center of the stack. In other words, the stack is symmetrically compensated. For example, with reference to the exemplary scheme of FIG. 13, and assuming that the Coff of the switches are the same, this would mean that the capacitance value of the compensation capacitors, from top to bottom, would be 45, 30, 18, 30 and 45 fF. Although such embodiment will not allow an equal voltage division across the FETs, it still improves the effective stack height compared to an uncompensated stack and it provides bi-directionality for those applications where such bi-directionality is requested. In addition, a symmetric configuration lessens the stack sensitivities to less than ideal conditions.

Figure 18:
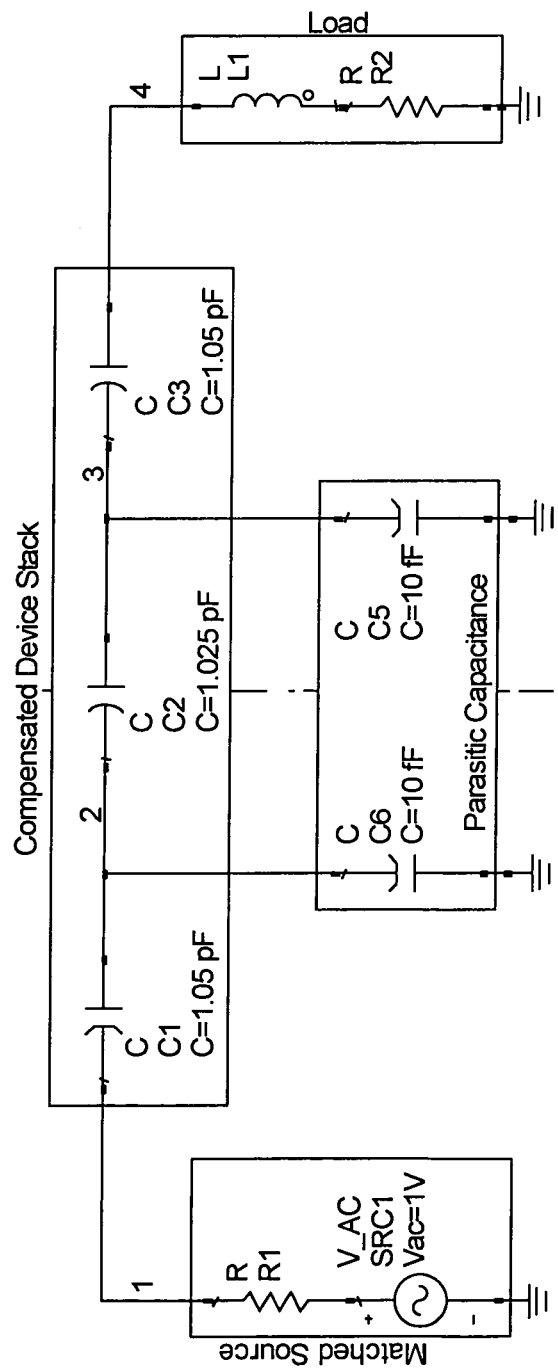
FIGS. 18-20 show behavior of a symmetric stack in presence of a reactive load.
Figure 19:
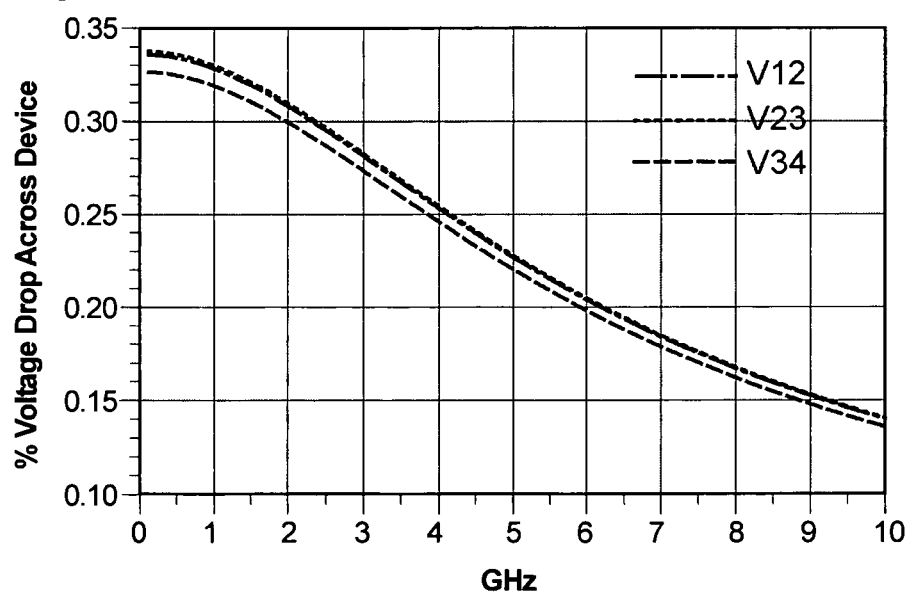
Figure 20:
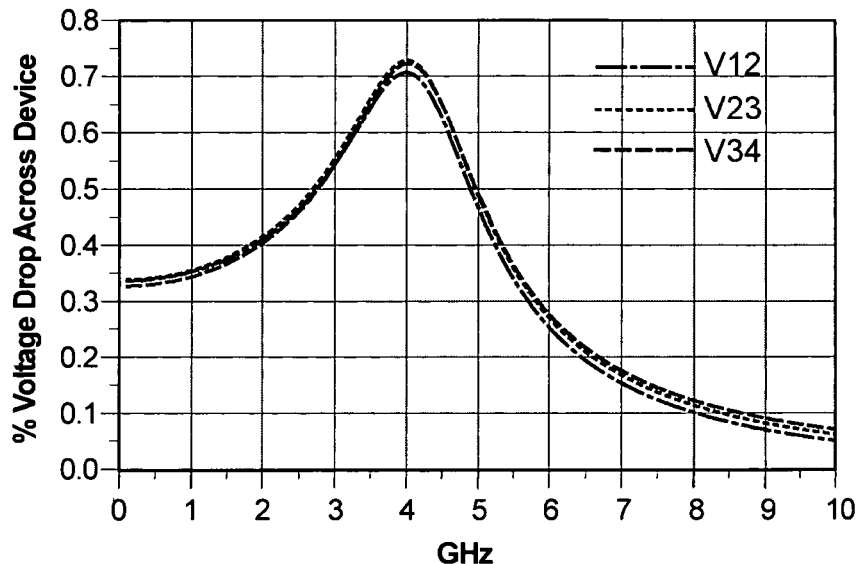

Reference can be made, for example, to FIGS. 18-20, where a symmetric scheme is shown. As shown in FIG. 18, a symmetric scheme is provided, where the 'top' (nearest to the source) capacitance C1 has the same value of the 'bottom' (farthest from the source) capacitance C3. The waveforms of FIGS. 19 and 20 show how V12, V23 and V34 are almost identical to each other. In particular, comparison between FIG. 17 and FIG. 20 shows the advantage of adopting a symmetrical arrangement in cases with a reactive load.

Turning now to the diagram of FIG. 14 (see also FIG. 21), it should be noted that placement of the MIM capacitors (40) across the FET stack in presence of parasitic capacitance can make the tunable capacitor stack non-reciprocal. In other words, the stack shown in FIG. 14 is not bi-directional in the sense that the effective capacitance and voltage handling differs depending on the port (RF+ or RF−) being driven.

Figure 21:
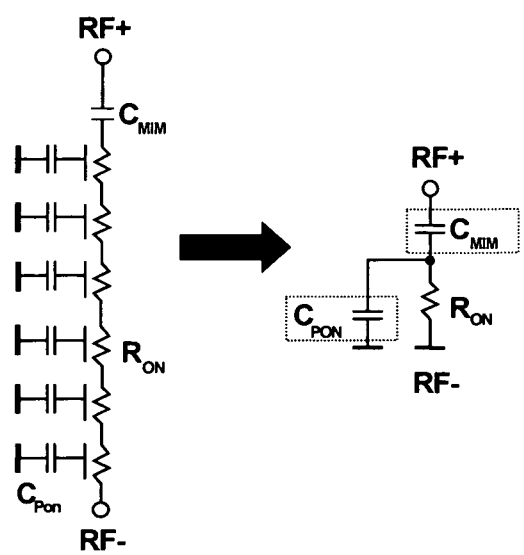
FIG. 21 shows a stack of ON resistances and ON parasitic capacitances of a DTC with a MIM capacitor on top of the stack.
Figure 22:
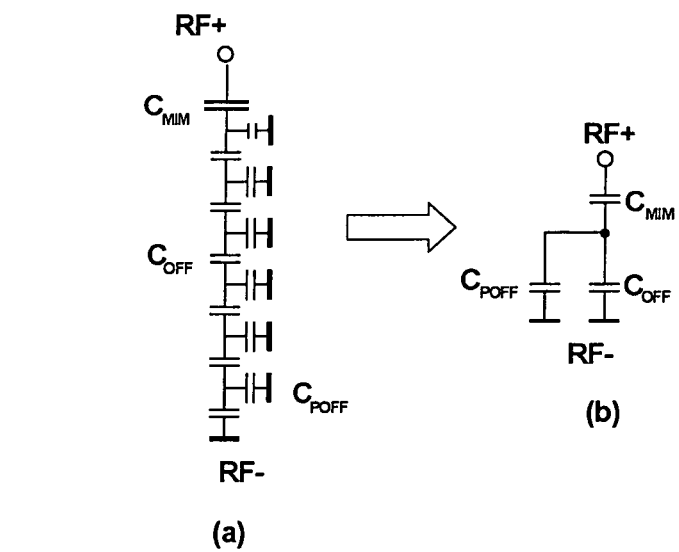
FIG. 22 shows a stack of OFF capacitances and OFF parasitic capacitances of a DTC.

In this respect, FIGS. 21 and 22 show simplified equivalent circuits of the stack of FETs, where the FETs are in an ON condition (FIG. 21) or in an OFF condition (FIG. 22). In FIG. 21, parasitic capacitances Cpon (50) are present to a ground node, and the stack in the ON condition can be represented by the equivalent circuit shown in FIG. 21(b). In the ON condition of FIGS. 21(a) and 21(b), when driving RF+, the parasitic capacitance Cpon is not seen because the impedance of Ron is much lower than the impedance of Cpon. Moreover, when driving RF−, Cpon appears in parallel with CMIM, thus increasing the effective capacitance. Therefore, in the ON condition, presence of the parasitic capacitances Cpon, although not necessarily a problem, can be a source of non-bidirectionality.

FIGS. 22(a) and 22(b) show a stack or arm of FET transistors with a MIM or MM capacitor on top in the OFF condition, where the circuit of FIG. 22(b) is the simplified circuital equivalent of the OFF arm of FIG. 22(a). In such case, when driving RF+, the effective capacitance seen is different from the capacitance seen when driving RF−. Such undesired difference can be explained, for example, with reference to the diagram of FIG. 23.

Figure 23:
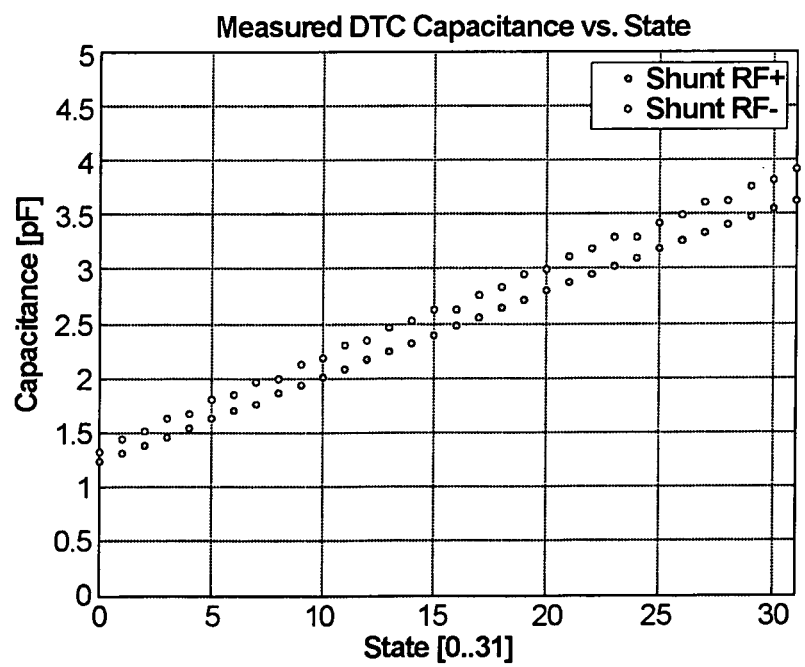
FIG. 23 shows a diagram where the capacitance of the circuit of FIG. 1 is measured as a function of the various states that the circuit of FIG. 1 can assume when driven at either RF+ or RF−.

In particular, FIG. 23 shows a diagram where the capacitance of the circuit of FIG. 1 is measured as a function of the various states that the circuit of FIG. 1 can assume. The 5-bit circuit of FIG. 1 can assume 32 states from 00000 (state 0, which corresponds to all bits being in the OFF state as shown in FIG. 22) to 11111 (state 31, which corresponds to all bits being in the ON state as shown in FIG. 21). The capacitance of the circuit for each state is represented in FIG. 23 for each of the 32 states. The top line of dots of FIG. 23 represents values where RF− is driven (shunt RF−), while the bottom line of dots of FIG. 23 represents values where RF+ is driven (shunt RF+). The difference in capacitance value for each state is a clear indication of the lack of bi-directionality of the circuit of FIG. 1 because of the presence of an offset due to the presence of a parasitic C term.

Figure 24:
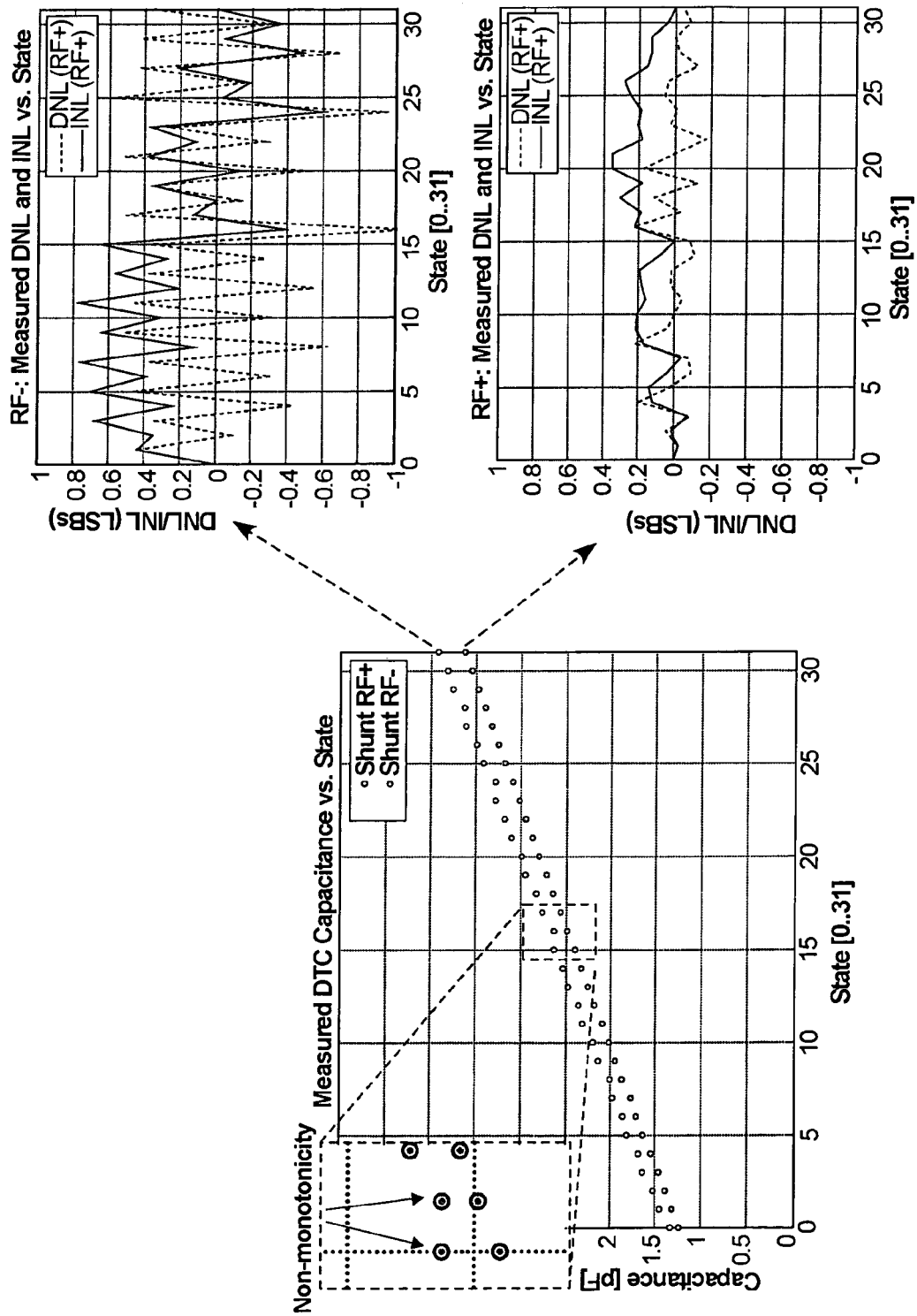
FIG. 24 shows diagrams indicating capacitance asymmetry depending on the polarity of the circuit of FIG. 1, i.e. whether the circuit is RF+ driven or RF− driven.

FIG. 24 shows diagrams indicating, in detail, the asymmetry of the DTC capacitance depending on the polarity in the shunt, i.e. whether the circuit is RF+ driven or RF− driven. In particular, FIG. 24(a) shows that there is a non-monotonicity of the capacitance values in the shunt RF− case, meaning that the capacitance for state 16 has a value that is inferior to the value for state 15. Such lack of monotonicity represents a problem, especially in closed loop applications. Such issue can be better appreciated in the diagrams of FIGS. 24(b) and 24(c) where differential linearity (DNL) and integral linearity (INL) signals are shown. In particular, DNL represents the actual step size versus the ideal step size, while INL represents the difference between capacitance values and a reference straight line drawn through the end points. Ideally, both DNL and INL should be equal to zero across the various states. The diagrams of FIGS. 24(b) and 24(c) show that the Shunt RF+ condition (circuit RF+ driven) of FIG. 24(c), although not ideal, is much better than the Shunt RF− condition (circuit RF− driven) of FIG. 24(b) where there is a large discrepancy between the ideal and real values of DNL and INL.

Figure 25:
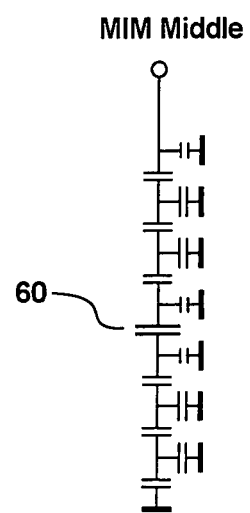
FIG. 25 shows a stack of OFF capacitances of digitally tunable capacitors (DTC) with metal-insulator-metal (MIM) capacitors in the middle of the stack.
Figure 26:
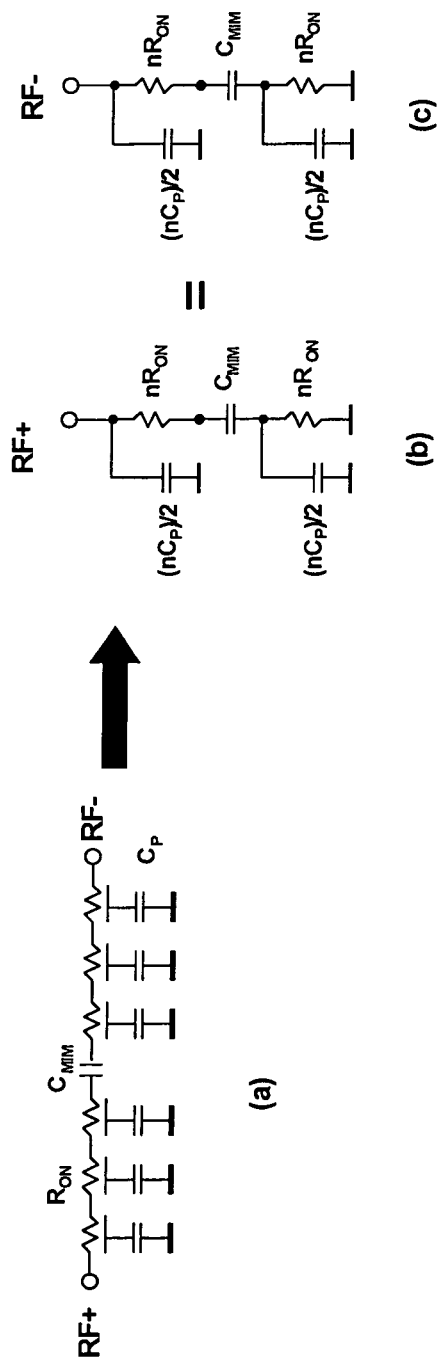
FIG. 26 shows an equivalent circuit with ON resistances and ON parasitic capacitances of a DTC with MIM capacitors in the middle of the stack.

A first embodiment of the present disclosure to solve the above mentioned problem is shown in the circuit of FIG. 25, where MIM or MM capacitor (60) is placed in the middle of the stack. See also FIGS. 26(a)-26(c). The presence of MIM capacitor (60) in the middle neither eliminates nor compensates the parasitic capacitance Cp. Rather, the parasitic capacitances are now symmetric about the MIM capacitor, so that the RF+ and RF− mirror each other both in the ON state and in the OFF state. Therefore, such embodiment eliminates asymmetries in the DTC capacitance, thus allowing the same capacitance value to be obtained whether driving RF+ or RF−. Moreover, the RF− DNL is improved, and the RF− quality factor Q is improved. Possible drawbacks of such embodiment are that the RF+ DNL degrades and the RF+ quality factor Q degrades.

In some embodiments, placement of a single MIM capacitor in the middle of the stack can not be advisable due to breakdown voltage limitations of the MIM capacitor. In such case, two or more MIM capacitors can be provided in series, to overcome such limitations.

Figure 27:
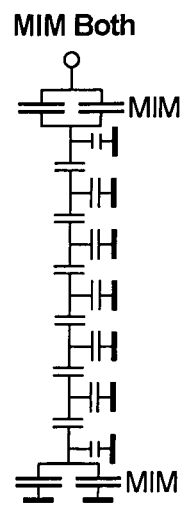
FIG. 27 shows a stack of OFF capacitances and parasitic capacitances of a DTC with MIM capacitors both on the top and the bottom of the stack, thus providing a symmetrical configuration.
Figure 28:
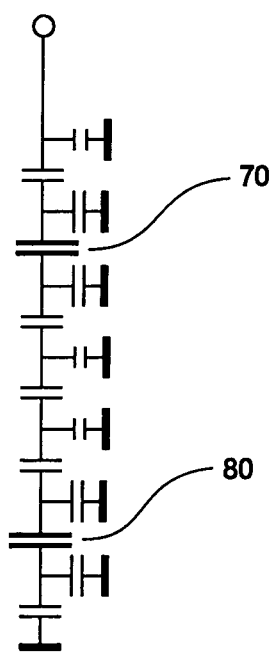
FIG. 28 shows a further symmetrical configuration of a stack of OFF capacitances and parasitic capacitances of a DTC including MIM capacitors.

According to further embodiments of the present disclosure, MIM capacitors can be placed in a variety of positions as long as they are symmetrical with respect to the center of the stack. By way of example, one possible placement could be to double the MIM capacitance and put one on each end of the stack, as shown in FIG. 27. In order to obtain the same effect of a single MIM, the MIM capacitances have been doubled, as shown in the figure. FIG. 28 shows a further embodiment of the present disclosure where MIM capacitors (70, 80) have been placed in positions that provide an overall symmetrical configuration.

Figure 29:
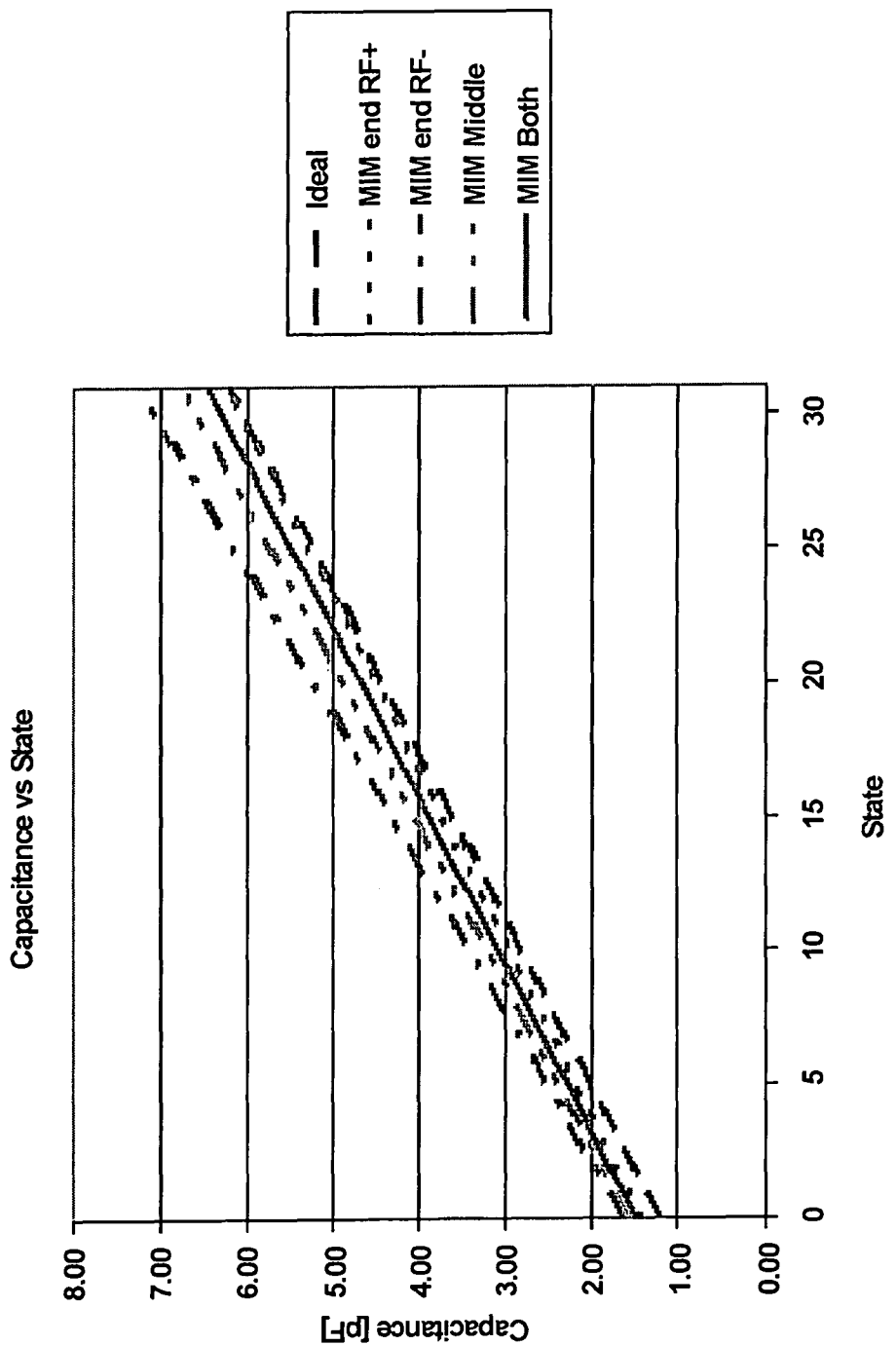
FIG. 29 shows a diagram where the capacitance of the circuit of FIG. 1 is measured as a function of the various states that the circuit of FIG. 1 can assume and as a function of the location of the MIM capacitors.

FIG. 29 shows a further capacitance vs. state diagram, this time with reference to five different scenarios: 1) ideal (first line from the bottom), assuming no parasitic C to ground 2) MIM at the RF+ end (second line from the bottom); 3) MIM at both ends (third line from the bottom); 4) MIM in the middle (fourth line from the bottom); and 5) MIM at the RF− end (fifth line from the bottom, first from the top). The diagram of FIG. 29 shows how for a typical scenario, the capacitance for the MIM at one end approach depends strongly on which end is driven (see distance between line 2 and line 5), while the symmetric approach is bilateral and closer to ideal.

Figure 30:
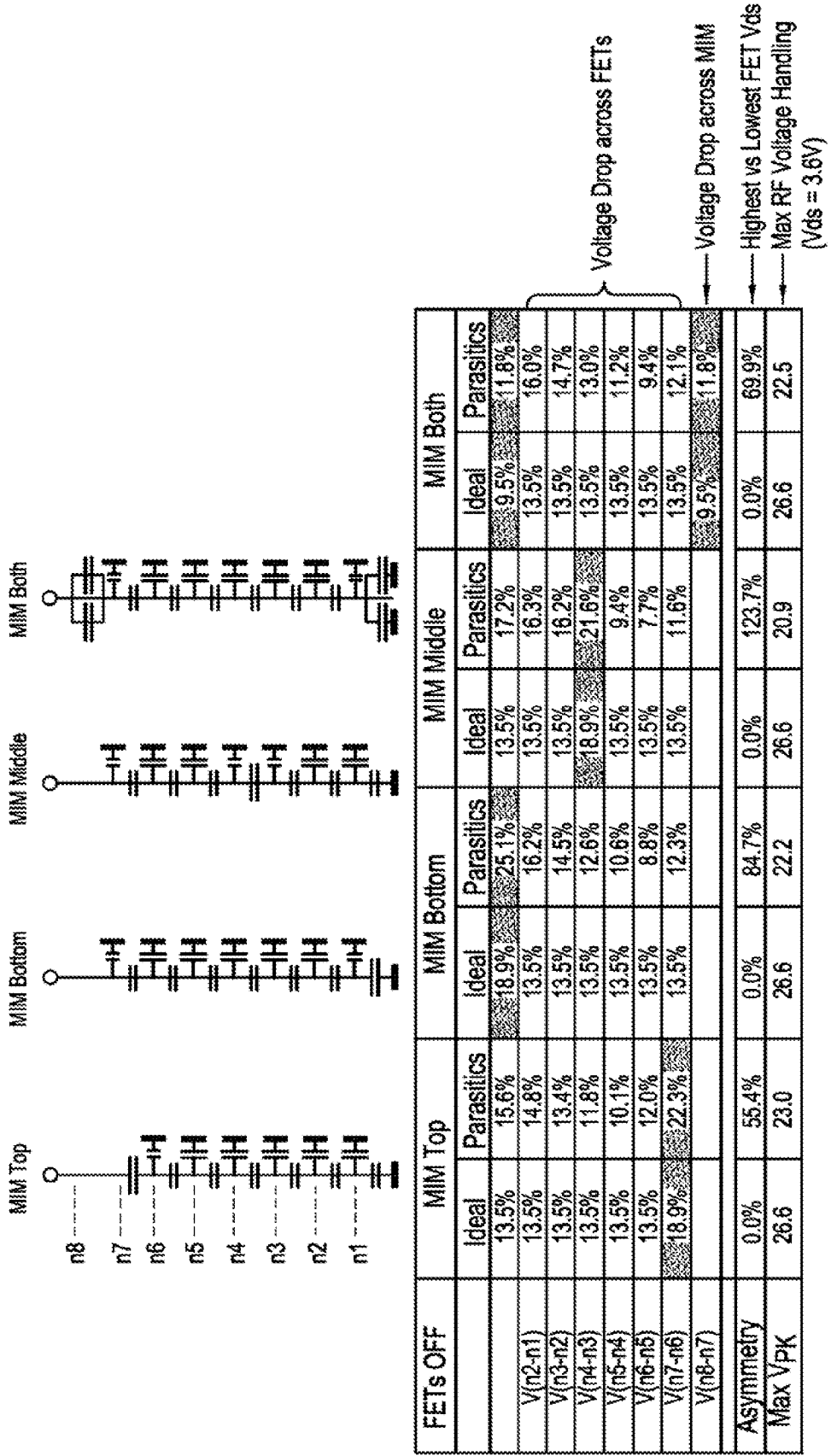
FIG. 30 shows a table where the four stack configurations of FIG. 10 are analyzed in terms of ideal voltage distribution and real voltage distribution due to the presence of parasitic capacitances.

FIG. 30 shows a table similar to the diagram of FIG. 29. FIG. 30 shows the effects of MIM placement on voltage division. The columns with the 'Parasitics' header take into account the parasitic C to ground. The last row (Max Vpk) is the maximum voltage capability of each configuration. It can be noted that the embodiment with MIM at the top and the embodiment with MIM at the bottom give different results, which is not desired because it means that the configuration is not bi-directional. It should also be noted that the table of FIG. 30 does not include any compensation.

Figure 31:
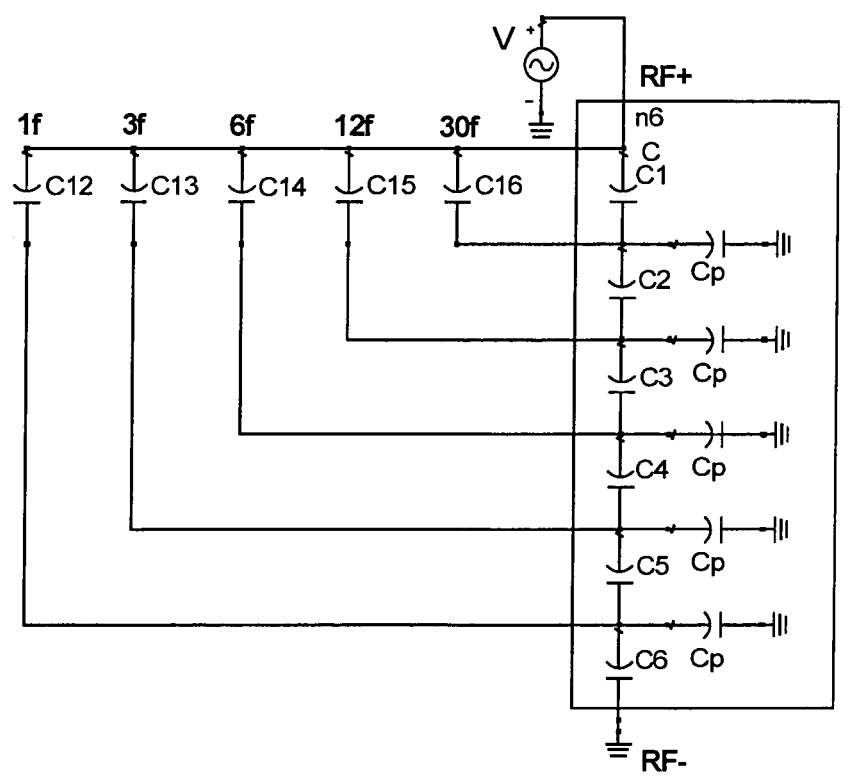
FIG. 31 shows a circuital diagram in accordance with a further embodiment of the disclosure.

FIG. 31 shows a further embodiment of the present disclosure. A stack of devices showing Coff capacitances C1 . . . C6 and respective parasitic capacitances as mentioned above is shown. According to this further embodiment, compensation capacitances C12 . . . C16 are provided. Differently from some of the previous embodiments where the compensation capacitances where provided in parallel to each device of the stack, in the present embodiment a first compensation capacitance C16 is provided across (in parallel with) the first device, a second compensation capacitance C15 is provided across the series of the first and second device, a third compensation capacitance C14 is provided across the series of the first, second and third device, and so on. The last compensation capacitance is provided across the series of all devices with the exclusion of the device farthest from the source (n-th device). Embodiments can also be provided where the compensating capacitors do not proceed up to the (n−1)-th device of the stack, but only proceed up to the i-th device of the stack, i=1, 2, . . . , n−1. In general, according to the embodiment of FIG. 31, i (with i=1, 2, . . . n−1) compensating capacitors can be provided for each embodiment, each embodiment comprising compensating capacitors located across the first device, the series of the first and second device, the series of the first, second and third device, up to the series of all devices from the first device to the i-th device.

Figure 32:
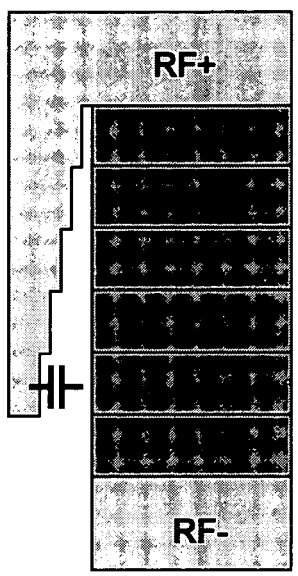
FIGS. 32 and 33 show examples of layouts in order to implement the circuital diagram of FIG. 31.
Figure 33:
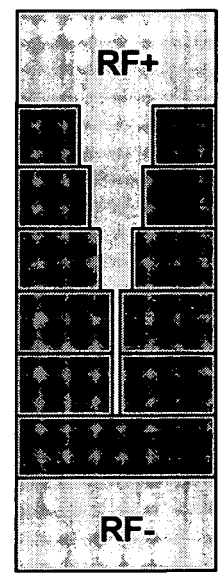

FIGS. 32 and 33 show exemplary layouts of the compensation capacitors in accordance with the embodiment of FIG. 31, where Metal-Metal (MM) compensation capacitors are used, by way of example. In particular, FIGS. 32 and 33 are views from the top of the stack of switches (disposed, e.g., in an interdigitated manner where the source of each switch is interdigitated with the drain of the device) disposed between the first terminal RF+ and the second terminal RF−.

As shown in FIG. 32, a capacitive effect is obtained by adding metal to the side of the switches in a controlled amount and at a controlled distance from each switch to obtain a controlled capacitive metal-insulator-metal effect between the RF+ node and each node of the stack. It should be noted how, in FIG. 32, the distance between the added metal and the stacked devices is variable (the larger the distance the lower the capacitance), to obtained a controllable capacitance effect.

In the embodiment of FIG. 33 the metal is added on top of the switches along a substantially central region of the same. In this case, the variable capacitive effect is obtained through control of the amount of metal deposited on the top of each switch.

Figure 34:
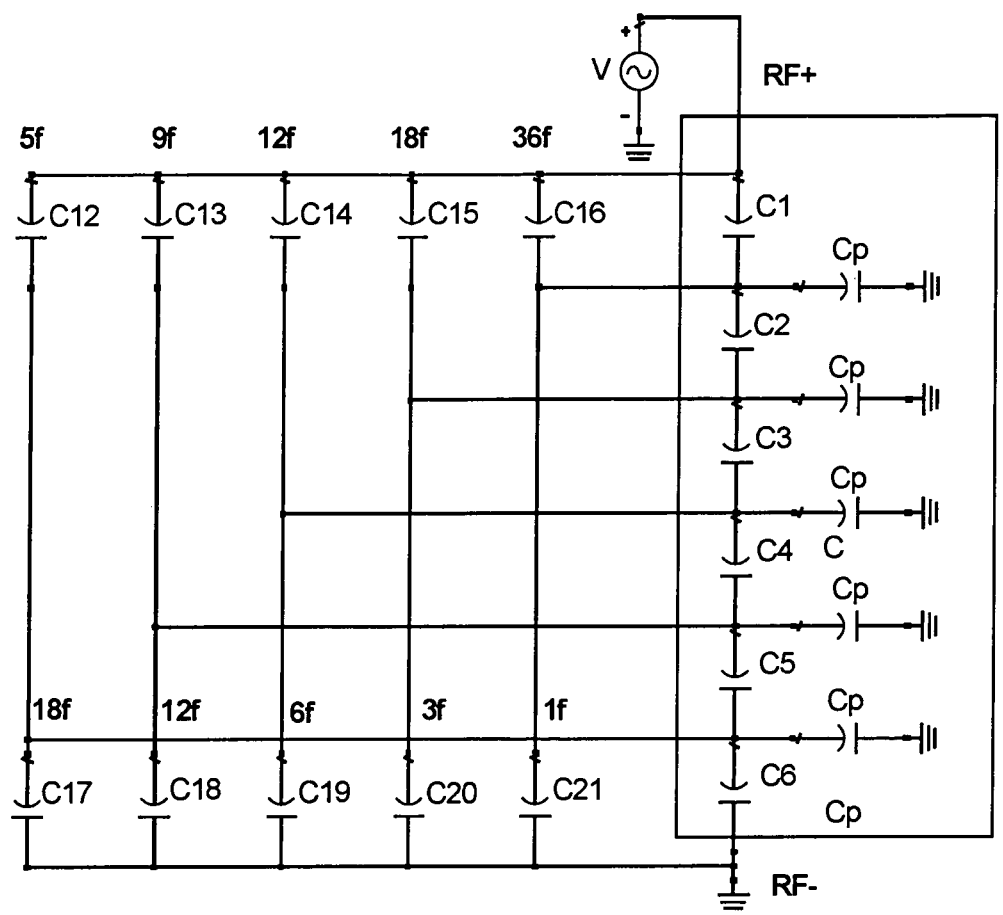
FIG. 34 shows a circuital diagram in accordance with a further embodiment of the disclosure.

FIG. 34 shows another embodiment of the present disclosure, similar to the embodiment of FIG. 31. Differently from the embodiment of FIG. 31, the embodiment of FIG. 34 shows additional compensation capacitances C17 . . . C21. A first additional compensation capacitance C17 is provided across (in parallel with) the last (n-th) device, a second compensation capacitance C18 is provided across the series of the n-th and (n−1)-th device, a third compensation capacitance C17 is provided across the series of the n-th, (n−1)-th and (n−2)-th device, and so on. The last additional compensation capacitance is provided across the series of all devices with the exclusion of the device closest to the source ($1^{st}$ device). Embodiments can also be provided where the additional compensating capacitors do not proceed up to the second device of the stack, but only proceed up to the (n−i+1)-th device of the stack, i=1, 2, . . . , n−1, depending on how many compensation capacitors have been provided on the top side of the stack. In general, according to the embodiment of FIG. 34, i (with i=1, 2, . . . n−1) compensating capacitors can be provided on each side of the stack for each embodiment, each embodiment comprising compensating capacitors located across the first device, the series of the first and second device, the series of the first, second and third device, up to the series of all devices from the first device to the i-th device, and corresponding compensating capacitors located across the n-th device, the series of the n-th and (n−1)-th device, the series of the n-th, (n−1)-th and (n−2)-th device, up to the series of all devices from the first device to the (n−i+1)-th device.

Figure 35:
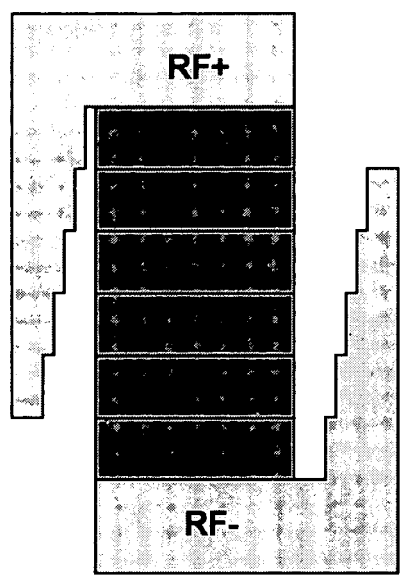
FIGS. 35 and 36 show examples of layouts in order to implement the circuital diagram of FIG. 34.
Figure 36:
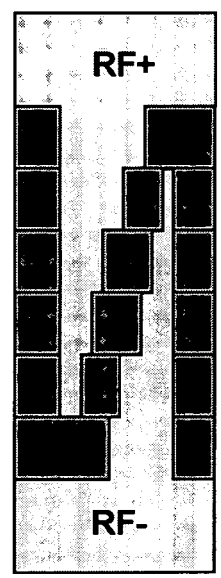

FIGS. 35 and 36 show exemplary layouts of the compensation capacitors in accordance with the embodiment of FIG. 34. The metal is added on the side or on top of the switches similarly to the embodiment of FIGS. 32 and 33.

Figure 37:
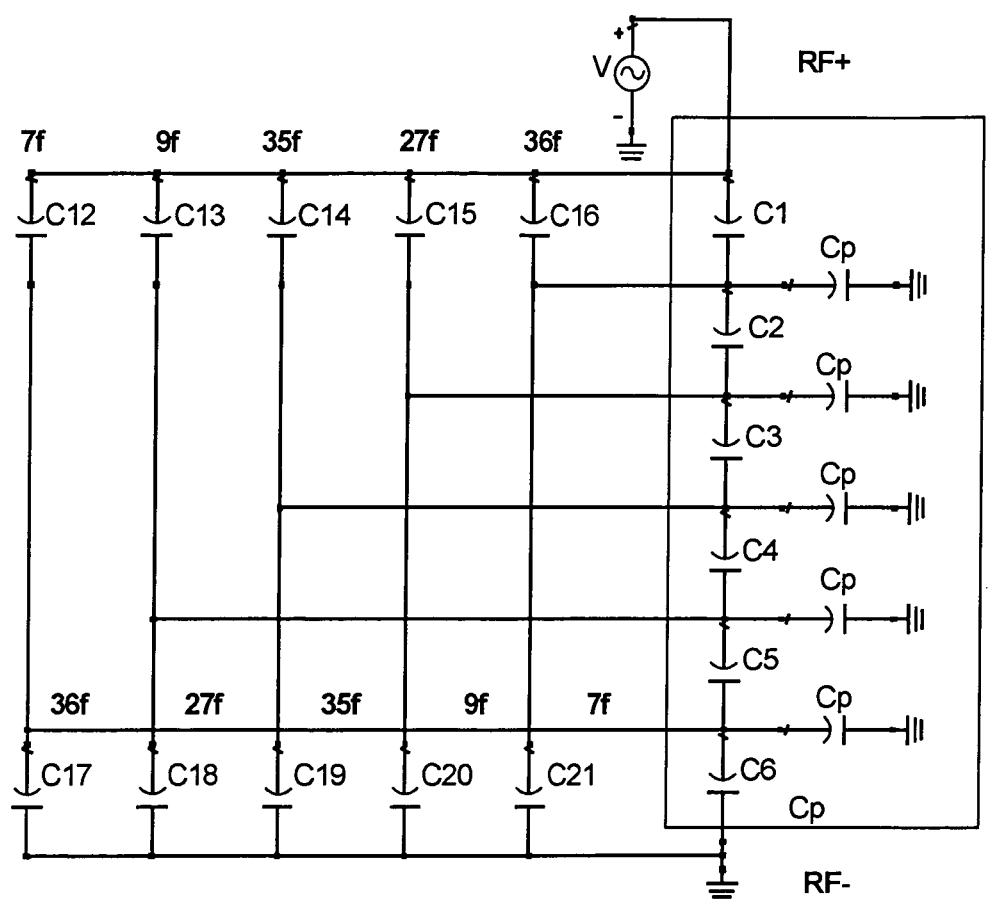
FIG. 37 shows a circuital diagram in accordance with a further embodiment of the disclosure.

FIG. 37 shows a further embodiment of the present disclosure, similar to the embodiment of FIG. 34. In the embodiment of FIG. 37, the compensation is symmetric. Each compensating capacitor on the top of the figure has a corresponding compensating capacitor on the bottom of the figure so that the resulting capacitance value on the top of the stack is the same as the resulting capacitance value on the bottom of the stack. As shown in FIG. 37, the resulting capacitance value between the first and the second node (36 pF) is the same as the resulting capacitance value between the n-th and the (n−1)-th node. Similarly, the resulting capacitance value between the first and the third node (27 pF) is the same as the resulting capacitance value between the n-th and the (n−2)-th node, and so on.

Figure 38:
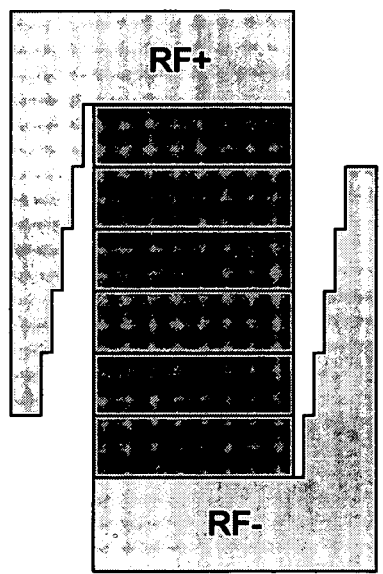
FIGS. 38 and 39 show examples of layouts in order to implement the circuital diagram of FIG. 37.
Figure 39:
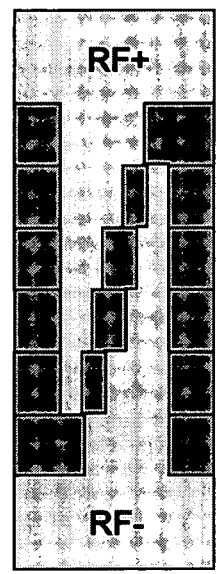

FIGS. 38 and 39 show exemplary layouts of the compensation capacitors in accordance with the embodiment of FIG.

37. The metal is added on the side or on top of the switches similarly to the embodiment of FIGS. 35 and 36.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The examples set forth above are provided to give those of ordinary skill in the art a complete disclosure and description of how to make and use the embodiments of the devices and methods for voltage handling of digitally tunable capacitors of the disclosure, and are not intended to limit the scope of what the inventors regard as their disclosure. Modifications of the above-described modes for carrying out the disclosure may be used by persons of skill in the video art, and are intended to be within the scope of the following claims.

A number of embodiments of the disclosure have been described. Nevertheless, it will be understood that various modifications may be made without departing from the spirit and scope of the present disclosure. Accordingly, other embodiments are within the scope of the following claims.

The invention claimed is:

1. A unit cell for a sub-circuit of a digitally tunable capacitor (DTC), the sub-circuit being adapted to be coupled between a first RF terminal and a second RF terminal, the unit cell comprising:
   a plurality of 2N switches coupled in series with M capacitors, the switches proceeding from a first switch closest the first RF terminal and farthest from the second RF terminal to a 2N-th switch farthest from the first RF terminal and closest to the second RF terminal;
   a first compensation capacitor stack, comprising (2N−1) stacked compensation capacitors, the (2N−1) stacked compensation capacitors being referred to as a first stacked compensation capacitor, a second stacked compensation capacitor, . . . , an i-th stacked compensation capacitor, . . . , to a (2N−1)-th stacked compensation capacitor, proceeding in a direction from the first RF terminal to the second RF terminal,
   wherein
      N and M represent integers greater than or equal to one,
      the M capacitors are placed between the N-th switch and the (N+1)-th switch in a manner such that a first stack of N switches from among the plurality of 2N switches is connected in series between the first RF terminal and the M capacitors, the M capacitors are connected in series between the first stack of N switches and a second stack of N switches from among the plurality of 2N switches, and the second stack of N switches is connected in series between the M capacitors and the second RF terminal,
      the i-th stacked compensation capacitor is connected in parallel with the first switch and an i-th switch and all switches in between, i being 1, 2, . . . , (2N−1), and
      the first compensation capacitor stack is configured to reduce the effect of parasitic capacitances of the plurality of 2N switches on the voltage across each switch when the plurality of 2N switches is off.

2. The unit cell of claim 1, wherein the M capacitors are metal-insulator-metal (MIM) capacitors or metal-metal (MM) capacitors.

3. The unit cell of claim 1, further comprising a first set of one or more capacitors placed between the first RF terminal and the first switch and a corresponding set of one or more capacitors placed between the 2N-th switch and the second RF terminal.

4. The unit cell of claim 2, further comprising a first set of one or more capacitors placed between the first RF terminal and the first switch and a corresponding set of one or more capacitors placed between the 2N-th switch and the second RF terminal.

5. A unit cell for a sub-circuit of a digitally tunable capacitor (DTC), the sub-circuit being adapted to be coupled between a first RF terminal and a second RF terminal, the unit cell comprising:
   a plurality of stacked switches coupled in series with one or more capacitors, the stacked switches proceeding from a first switch closest the first RF terminal and farthest from the second RF terminal to an n-th switch farthest from the first RF terminal and closest to the second RF terminal, wherein
   the one or more capacitors comprise a first set of one or more capacitors placed between the i-th and the (i+1)-th switch and a second set of one or more capacitors placed between the (n−i)-th and the (n−i+1)-th switch, i=1, 2, . . . , (2N−1).

6. The unit cell of claim 5, wherein the one or more capacitors are metal-insulator-metal (MIM) capacitors or metal-metal (MM) capacitors.

7. The unit cell of claim 1, wherein the second RF terminal is ground.

8. The unit cell of claim 2, wherein the second RF terminal is ground.

9. The unit cell of claim 1, wherein the sub-circuit is a significant bit sub-circuit of a digitally tunable capacitor (DTC) having multiple bits.

10. An electrical circuit comprising one or more unit cells according to claim 1.

11. A voltage handling method comprising:
   providing a plurality of 2N stacked switches, the stacked switches proceeding from a first switch closest to a first terminal and farthest from a second terminal to a 2N-th switch farthest from the first terminal and closest to the second terminal, the first terminal being a terminal through which a voltage source is coupled to the unit cell;
   providing a compensation capacitor stack comprising (2N−1) stacked compensation capacitors, the (2N−1) stacked compensation capacitors being referred to as a first stacked compensation capacitor, a second stacked compensation capacitor, . . . , an i-th stacked compensation capacitor, . . . , to a (2N−1)-th stacked compensation capacitor, proceeding in a direction from the first RF terminal to the second RF terminal;
   coupling the stacked switches in series with M capacitors in a manner such that the M capacitors are between the N-th switch and the (N+1)-th switch; and
   configuring the compensation capacitor stack to reduce the effect of parasitic capacitances of the plurality of 2N switches on the voltage across each stacked switch when the plurality of 2N switches is off,
   wherein
      N and M represent integers greater than or equal to one,
      a first stack of N switches from among the plurality of 2N switches is connected in series between the first RF terminal and the M capacitors, the M capacitors are connected in series between the first stack of N switches and a second stack of N switches from among the plurality of 2N switches, and the second stack of N switches is connected in series between the M capacitors and the second RF terminal, and the i-th stacked compensation capacitor is connected in parallel with the first switch and an i-th switch and all switches in between, i being 1, 2, . . . , (2N−1).

12. The method of claim 11, wherein the first and the second terminal are RF terminals.

13. The unit cell of claim 1, further comprising:

a second compensation capacitor stack, comprising (2N−1) stacked compensation capacitors, the (2N−1)-th stacked compensation capacitor being referred to as a first stacked compensation capacitor of the second compensation capacitor stack, a second stacked compensation capacitor of the second compensation capacitor stack, . . . , a j-th stacked compensation capacitor of the second compensation capacitor stack, . . . , to a (2N−1)-th stacked compensation capacitor of the second compensation capacitor stack, proceeding in a direction from the first RF terminal to the second RF terminal, wherein the j-th stacked compensation capacitor of the second compensation capacitor stack is connected in parallel with the (2N)-th switch and the (2N−j)-th switch and all switches in between, j being 0, 1, . . . , (2N−2), and the first compensation capacitor stack and the second compensation capacitor stack are configured to reduce the effect of parasitic capacitances of the switch stack on the voltage across each stacked switch when the switch stack is off.

14. The unit cell of claim 5, further comprising a compensation capacitor stack, comprising (n−1) stacked compensation capacitors, the (n−1) stacked compensation capacitors being referred to as a first stacked compensation capacitor, a second stacked compensation capacitor, . . . , a j-th stacked compensation capacitor, . . . , to a (n−1)-th stacked compensation capacitor, proceeding in a direction from the first RF terminal to the second RF terminal, wherein the j-th stacked compensation capacitor is connected in parallel with the first stacked switch and the j-th stacked switch and all stacked switches in between, j being 1, 2, . . . , (n−1), and the compensation capacitor stack is configured to reduce the effect of parasitic capacitances of the switch stack on the voltage across each stacked switch when the switch stack is off.

15. A unit cell for a sub-circuit of a digitally tunable capacitor (DTC), the sub-circuit being adapted to be coupled between a first RF terminal and a second RF terminal, the unit cell comprising:

a plurality of 2N switches coupled in series with M capacitors, the switches proceeding from a first switch closest the first RF terminal and farthest from the second RF terminal to a 2N-th switch farthest from the first RF terminal and closest to the second RF terminal; and a compensation capacitor stack, comprising (2N−1) stacked compensation capacitors, the (2N−1) stacked compensation capacitors being referred to as a first stacked compensation capacitor, a second stacked compensation capacitor, . . . , an i-th stacked compensation capacitor, . . . , to a (2N−1)-th stacked compensation capacitor, in a direction proceeding from the first RF terminal to the second RF terminal, wherein N and M represent integers greater than or equal to one, the M capacitors are placed between the N-th switch and the (N+1)-th switch in a manner such that a first stack of N switches from among the plurality of 2N switches is connected in series between the first RF terminal and the M capacitors, the M capacitors are connected in series between the first stack of N switches and a second stack of N switches from among the plurality of 2N switches, and the second stack of N switches is connected in series between the M capacitors and the second RF terminal, the i-th stacked compensation capacitor is connected in parallel with the i-th stacked switch, i being 1, 2, . . . , (2N−1), the first and the (2N−1)-th stacked compensation capacitors are equal in capacitance value and have the greatest capacitance value among stacked compensation capacitors in the compensation capacitor stack, the j-th and the (2N−j)-th stacked compensation capacitors are equal in capacitance values, with capacitance values decreasing as j increases, j being 2, 3, . . . N, and capacitance values of the stacked compensation capacitors are configured to reduce the effect of parasitic capacitances of the switch stack on the voltage across each stacked switch when the plurality of 2N switches is off.

* * * * *